us009667325B1

United States Patent
Wang et al.

(10) Patent No.: US 9,667,325 B1
(45) Date of Patent: May 30, 2017

(54) RECEIVER DEVICE APPLIED TO MIMO SYSTEM AND CONTROL METHOD USING THE SAME

(71) Applicant: Industrial Technology Research Institute, Hsinchu (TW)

(72) Inventors: Chang-Jen Wang, New Taipei (TW); Chao-Kai Wen, Kaohsiung (TW); Jen-Yuan Hsu, Kinmen County (TW); Chiu-Ping Wu, Hsinchu County (TW); Yu-Han Kao, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/085,159

(22) Filed: Mar. 30, 2016

(30) Foreign Application Priority Data

Dec. 16, 2015 (TW) .............................. 104142223 A

(51) Int. Cl.
*H04L 27/06* (2006.01)
*H04B 7/0413* (2017.01)
(Continued)

(52) U.S. Cl.
CPC .......... *H04B 7/0413* (2013.01); *H03M 1/002* (2013.01); *H03M 1/12* (2013.01); *H04L 27/38* (2013.01)

(58) Field of Classification Search
CPC ................................ H03M 1/002; H03M 1/12
(Continued)

(56) References Cited

U.S. PATENT DOCUMENTS

| 5,889,814 | A | 3/1999 | Simmons |
|---|---|---|---|
| 7,194,237 | B2 | 3/2007 | Sugar et al. |

(Continued)

FOREIGN PATENT DOCUMENTS

| CN | 101027572 A | 8/2007 | |
|---|---|---|---|
| DE | EP 2403145 A1 * | 1/2012 | ............ H03M 1/121 |

(Continued)

OTHER PUBLICATIONS

Kester, Walt, "ADC Architectures V: Pipelined Subranging ADCs," MT-024 Tutorial, Oct. 2008, pp. 1-14, Analog Devices, US.

(Continued)

*Primary Examiner* — Wednel Cadeau

(57) ABSTRACT

The present disclosure discloses a receiver device, including receiving antennas, radio frequency receivers, a configurable precision analog-to-digital converter, a switch device, a baseband processor, and an analog-to-digital controller. The switch device converts a first number of baseband analog signals into a second number of baseband analog signals. The configurable precision analog-to-digital converter converts the second number of baseband analog signals into a third number of first baseband digital signals. The configurable precision analog-to-digital converter combines at least two of first analog-to-digital converters into at least one second analog-to-digital converter so that the total number of the rest of the first analog-to-digital converters and the at least one second analog-to-digital converters is equal to the third number. The resolution of each of the second analog-to-digital converters is higher than the resolution of each of the first analog-to-digital converters.

23 Claims, 15 Drawing Sheets

(51) Int. Cl.
*H04L 27/38* (2006.01)
*H03M 1/12* (2006.01)
*H03M 1/00* (2006.01)

(58) Field of Classification Search
USPC .................. 375/267, 233; 455/427, 132, 133
See application file for complete search history.

(56) References Cited

U.S. PATENT DOCUMENTS

| | | |
|---|---|---|
| 8,031,808 B2 | 10/2011 | Hammerschmidt et al. |
| 9,065,523 B2 | 6/2015 | Campos et al. |
| 9,077,655 B2 | 7/2015 | Babiarz et al. |
| 9,106,493 B2 | 8/2015 | Hong et al. |
| 9,231,632 B2 | 1/2016 | Kang et al. |
| 2005/0105632 A1* | 5/2005 | Catreux-Erces ..... H04B 7/0615 375/267 |
| 2007/0252745 A1 | 11/2007 | Garlapati et al. |

FOREIGN PATENT DOCUMENTS

| | | | | |
|---|---|---|---|---|
| SE | WO 2007055647 A2 * | 5/2007 | ........... | H04B 1/1027 |
| TW | I308427 | 4/2009 | | |

OTHER PUBLICATIONS

A Mahesh Kumar, "A Novel Architecture for a Low Power and Variable Resolution Flash ADC," Thesis, May 2010, 119 pages, International Institute of Information Technology, India.

Chao-Kai Wen et al., "Joint Channel-and-Data Estimation for Large-MIMO Systems with Low-Precision ADCs," 2015 IEEE International Symposium on Information Theory (ISIT), Jun. 2015, 7 pages, National Sun Yat-sen University, Taiwan.

M.A. Girnyk et al., "Large-System Analysis of Correlated MIMO Multiple Access Channels with Arbitrary Signaling in the Presence of Interference," IEEE Transaction on Wireless Communications, Mar. 2014, pp. 2060-2073, vol. 13, Issue 4, IEEE, US.

E.G. Larsson et al., "Massive MIMO for Next Generation Wireless Systems," IEEE Communications Magazine, Feb. 2014, 20 pages, vol. 52, Issue 2, IEEE, US.

Ning Liang et al., "Mixed-ADC Massive MIMO," Department of EEIs, University of Science and Technology of China, Apr. 2015, 30 pages, IEEE, China.

Mezghani et al., "Multiple Parameter Estimation with Quantized Channel Output," 2010 International ITG Workshop on Smart Antennas, Feb. 2010, pp. 143-150, IEEE, US.

S. Wang et al., "Multiuser Detection for Uplink Large-scale MIMO," 2014 IEEE International Conference on Communications, Jun. 2014, pp. 4460-4465, IEEE, US.

Marzetta et al., "Noncooperative Cellular Wireless with Unlimited Numbers of Base Station Antennas," IEEE Transactions on Wireless Communications, Oct. 2010, pp. 3590-3600, vol. 9, Issue 11, IEEE, US.

* cited by examiner

RECEIVER DEVICE APPLIED TO MIMO SYSTEM AND CONTROL METHOD USING THE SAME

CROSS REFERENCE TO RELATED APPLICATION

The present application is based on, and claims priority from, Taiwan Application Number 104142223, filed on Dec. 16, 2015, the invention of which is hereby incorporated by reference herein in its entirety.

TECHNICAL FIELD

The disclosure relates to a receiver device, more particular to a receiver device containing a configurable precision analog-to-digital converter.

BACKGROUND

In order to avoid loss of efficacy caused by quantization error, high-resolution analog-to-digital converters are used in receiver structures of current electrical communication devices in wireless communication systems. Compared to prior wireless communication technologies, next generation wireless communication technologies (for example, 5th generation mobile networks or 5th generation wireless systems) require a larger transmission frequency band and more receiving antennas.

However, increasing the transmission frequency band requires substantially increases the same frequency of the high-resolution analog-to-digital converter, and thereby increases power consumption of the high-resolution analog-to-digital converter. Increasing power consumption of the high-resolution analog-to-digital converter will cause the power of the electrical communication device to run out faster. In addition, increasing the number of receiving antennas (for example, massive multi-input multi-output system, massive MIMO system) correspondingly requires more high-resolution analog-to-digital converter. This results in increasing the cost of the receiver structure. In view of this, the present disclosure provides a receiver device containing a configurable precision analog-to-digital converter.

SUMMARY

An embodiment of the present disclosure provides a receiver device used in a multi-input multi-output communication system. The receiver device comprises a plurality of receiving antennas, a plurality of radio frequency receivers, a switch device, a configurable precision analog-to-digital converter, a baseband processor and an analog-to-digital conversion controller. The receiving antennas are used to receive a first number of analog radio frequency signals. The radio frequency receivers respectively coupled to the receiving antennas, wherein the radio frequency receivers are used to process the first number of the analog radio frequency signals and generate the first number of analog baseband signals. The switch device is electrically connected to the radio frequency receivers, wherein the switch device receives the first number of the analog baseband signals and outputs, according to mapping information, a second number of the analog baseband signals. The configurable precision analog-to-digital converter is electrically connected to the switch device, receives the second number of the analog baseband signals, and generates a third number of first digital baseband signals, wherein the third number is less than the second number. The configurable precision analog-to-digital converter comprises a plurality of first analog-to-digital converters and a bit combiner. The first analog-to-digital converters are used to convert the second number of the analog baseband signals into the second number of second digital baseband signals, wherein the configurable precision analog-to-digital converter combines, according to converter configurable information, at least two of the first analog-to-digital converters as at least one second analog-to-digital converter so that the total number of the rest of the first analog-to-digital converters and the at least one second analog-to-digital converter is equal to the third number, and resolution of each of the second analog-to-digital converters is higher than resolution of each of the first analog-to-digital converters. The bit combiner is used to converts the second number of the second digital baseband signals into the third number of the first digital baseband signals. The baseband processor is electrically connected to the switch device and the configurable precision analog-to-digital converter, and used to process the third number of the first digital baseband signals and output channel information according to the first digital baseband signals. The analog-to-digital conversion controller is respectively and electrically connected to the switch device, the configurable precision analog-to-digital converter and the baseband processor, wherein the analog-to-digital conversion controller determines the mapping information and the converter configurable information according to the channel information; and wherein the analog-to-digital conversion controller respectively outputs the mapping information and the converter configurable information to the switch device and the configurable precision analog-to-digital converter.

An embodiment of the present disclosure provides a control method applied to the receiver device. The control method comprises determining whether the analog-to-digital conversion controller has full channel statistical information of the multi-input multi-output communication system or not according to the channel information; informing the receiver device to be in a first mode or a second mode according to obtaining the full channel statistical information or not; informing the receiver device to be in the first mode if the full channel statistical information is not obtained, wherein when the receiver device is in the first mode, the analog-to-digital conversion controller periodically changes the mapping information so that each of the second analog-to-digital converters in turn outputs each of the first digital baseband signals corresponding to each of the receiving antennas; and wherein the baseband processor obtains the channel information according to the first digital baseband signals which are corresponding to the at least one second analog-to-digital converter.

BRIEF DESCRIPTION OF THE DRAWINGS

The present disclosure can be more fully understood by reading the subsequent detailed description and examples with references made to the accompanying drawings, wherein.

DESCRIPTION OF THE EMBODIMENTS

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Figure 1:
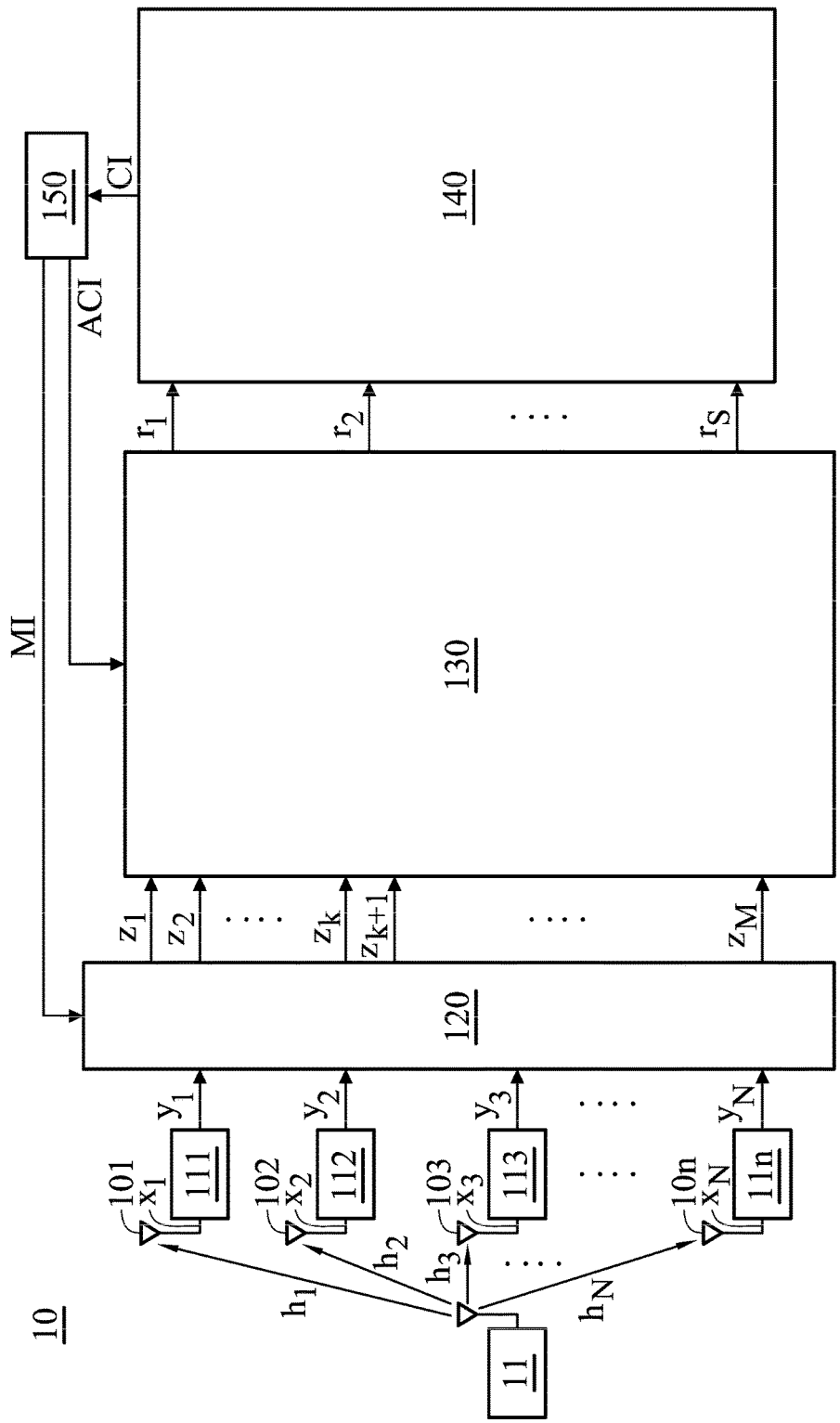
FIG. 1 shows a block diagram of a receiver device 10 according to a first embodiment of the present disclosure.

FIG. 1 shows a block diagram of a receiver device 10 used in a multi-input multi-output (MIMO) communication system according to a first embodiment of the present disclosure. In the first embodiment, the receiver device 10 receives wireless signals from a transceiver device 11 through wireless communication channels, wherein channel effects with each of the wireless sub-channels are represented by channel signals $h_1 \sim h_n$. In the first embodiment, the receiver device 10 comprises a plurality of receiving antennas $101 \sim 10n$, a plurality of radio frequency receivers $111 \sim 11n$, a switch device 120, a configurable precision analog-to-digital converter 130, a baseband processor 140 and an analog-to-digital conversion controller 150.

In the first embodiment, the receiving antennas $101 \sim 10n$ are used to receive a first number (N) of a plurality of analog radio frequency signals $x_1 \sim x_N$. The radio frequency receivers $111 \sim 11n$ are respectively coupled to the receiving antennas $101 \sim 10n$, used to process the first number (N) of the analog radio frequency signals $x_1 \sim x_N$, and generate the first number (N) of a plurality of analog baseband signals $y_1 \sim y_N$. In the first embodiment, the switch device 120 is electrically connected to the radio frequency receivers $111 \sim 11n$. The switch device 120 receives the first number (N) of the analog baseband signals $y_1 \sim y_N$ and outputs, according to mapping information (Mapping vector Information, MI), a second number (M) of a plurality of analog baseband signals $z_1 \sim z_M$, wherein the second number (M) is greater than the first number (N).

In the first embodiment, the configurable precision analog-to-digital converter 130 is electrically connected to the switch device 120. The configurable precision analog-to-digital converter 130 receives the second number (M) of the analog baseband signals $z_1 \sim z_M$ and generates a third number (S) of a plurality of first digital baseband signals $r_1 \sim r_S$, wherein the third number (S) is less than the second number (M). The baseband processor 140 is electrically connected to the configurable precision analog-to-digital converter 130. The baseband processor 140 is used to process the first digital baseband signals $r_1 \sim r_S$ and outputs channel information (CI) to the analog-to-digital conversion controller 150 according to the first digital baseband signals $r_1 \sim r_S$. The channel information (CI) comprises coherence time, channel correlated coefficients, or channel response of each sub-channel of the MIMO communication system. The analog-to-digital conversion controller 150 is respectively and electrically connected to the switch device 120, the configurable precision analog-to-digital converter 130 and the baseband processor 140. The analog-to-digital conversion controller 150 adjusts the mapping information (MI) and converter configurable information (ADC Configuration Information, ACI) according to the channel information (CI), and respectively outputs the mapping information (MI) and the converter configurable information (ACI) to the switch device 120 and the configurable precision analog-to-digital converter 130.

Figure 2:
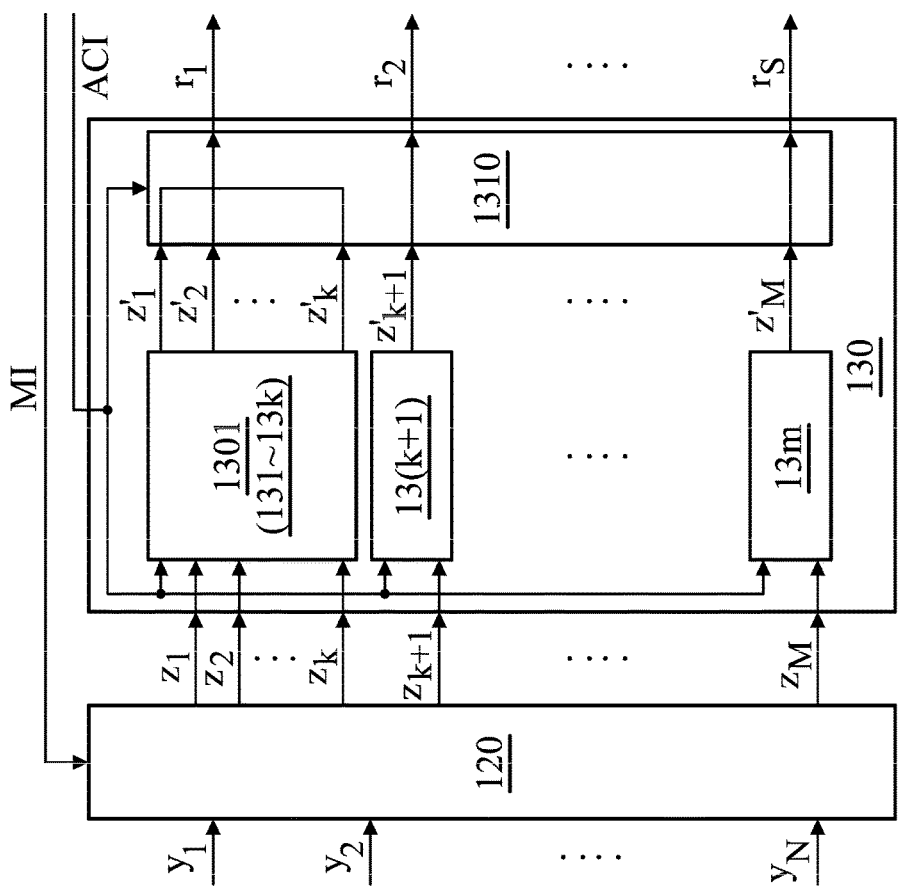
FIG. 2 shows a schematic diagram of the switch device 120 and the configurable precision analog-to-digital converter 130 according to a second embodiment of the present disclosure.

FIG. 2 shows a schematic diagram of the switch device 120 and the configurable precision analog-to-digital converter 130 according to a second embodiment of the present disclosure. In the second embodiment, the configurable precision analog-to-digital converter 130 comprises a plurality of first analog-to-digital converters $131 \sim 13m$ and a bit combiner 1310. The first analog-to-digital converter $131 \sim 13m$ are used to convert the second number (M) of the analog baseband signals $z_1 \sim z_M$ into second number (M) of a plurality of second digital baseband signals $z_1' \sim z_M'$.

In the second embodiment, the configurable precision analog-to-digital converter 130 combines, according to the converter configurable information (ACI), at least two of the first analog-to-digital converters $131 \sim 13m$ (for example, $131 \sim 13k$) as at least one second analog-to-digital converter 1301 so that the total number of the rest of the first analog-to-digital converters (for example, $13(k+1) \sim 13m$) and the at least one second analog-to-digital converter 1301 is equal to the third number (S). For example, when the configurable precision analog-to-digital converter 130 combines, according to the converter configurable information (ACI), four first analog-to-digital converters $131 \sim 134$ as the single second analog-to-digital converter 1301, the third number (S)=9−4+1=6. For example, when the configurable precision analog-to-digital converter 130 respectively combines, according to the converter configurable information (ACI), the first analog-to-digital converters $131 \sim 133$ and the first analog-to-digital converters $134 \sim 136$ as the second analog-to-digital converters 1301 and 1302, the third number (S)=9−6+2=5. Through the above configuration method, the configurable precision analog-to-digital converter 130 dynamically adjusts, according to the converter configurable information (ACI), a required ratio of the first second analog-to-digital converters and the second analog-to-digital converters.

In the second embodiment, the first analog-to-digital converters $131 \sim 13m$ are low-resolution analog-to-digital converters. Because the second analog-to-digital converter 1301 is a high-resolution analog-to-digital converter consisting of the first analog-to-digital converters $131 \sim 13k$, the resolution of the second analog-to-digital converter 1301 is higher than the resolution of each of the first analog-to-digital converters $131 \sim 13k$. In addition, it is noticeable that the first analog-to-digital converters $131 \sim 13m$ can be low-resolution analog-to-digital converters with different resolutions. For example, the first analog-to-digital converters $131 \sim 135$ are low-resolution analog-to-digital converters with 3-bit resolution, and the first analog-to-digital converters $136 \sim 13m$ are low-resolution analog-to-digital converters with 2-bit resolution.

In the second embodiment, the bit combiner 1310 converts the second digital baseband signals $z_1'\sim z_M'$ into the first digital baseband signals $r_1\sim r_S$, wherein the bit combiner 1310 integrates the second digital baseband signals outputted from each of the at least one second analog-to-digital converter as the single first digital baseband signal. For example, the bit combiner 1310 integrates the second digital baseband signals $z_1'\sim z_K'$ outputted from the second analog-to-digital converter 1301 as the first digital baseband signal $r_1$.

Figure 3:
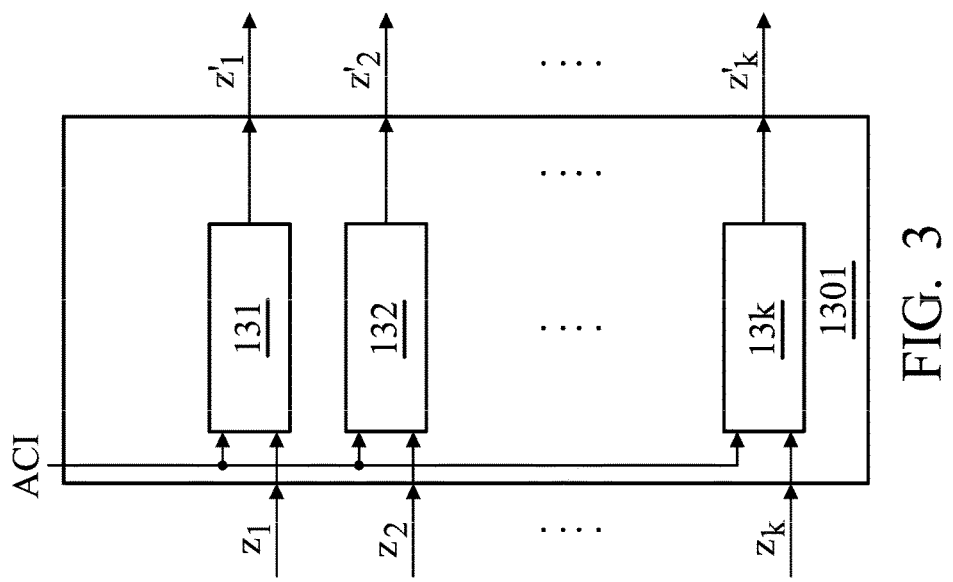
FIG. 3 shows a configuration diagram of the second analog-to-digital converter 1301 according to a third embodiment of the present disclosure.

FIG. 3 shows a configuration diagram of the second analog-to-digital converter 1301 according to a third embodiment of the present disclosure. In the third embodiment, each of the first analog-to-digital converters 131~13$k$ receives the converter configurable information (ACI) from the analog-to-digital conversion controller 150, wherein the converter configurable information (ACI) can be a control signal used to determine whether the first analog-to-digital converter is integrated with other first analog-to-digital converters or not. In the third embodiment, the second analog-to-digital converter 1301 is a pseudo high precision analog-to-digital converter consisting of the first analog-to-digital converters 131~13$k$. The second analog-to-digital converter 1301 adjusts, according to the converter configurable information (ACI), discriminant level and bit relation of each of the first analog-to-digital converters 131~13$k$ to combine output signals of the first analog-to-digital converters 131~13$k$ as output signals of the high precision analog-to-digital converter. Accordingly, the analog-to-digital conversion controller 150 can integrate K first analog-to-digital converters 131~13$k$ as the second analog-to-digital converter 1301 according to the converter configurable information (ACI).

In the third embodiment, the second analog-to-digital converter 1301 is used to convert K analog baseband signals $z_1\sim z_K$ into K second digital baseband signals $z_1'\sim z_K'$, wherein the K analog baseband signals $z_1\sim z_K$ can be the analog baseband signal (for example, the analog baseband signal $y_1$) outputted by same radio frequency receiver (for example, radio frequency receiver 111). Accordingly, the second analog-to-digital converter 1301 provides high precision analog-to-digital function on specific radio frequency receiver.

In the third embodiment, the bit combiner 1310 integrates the second digital baseband signals $z_1'\sim z_K'$ outputted from the second analog-to-digital converter 1301 as the first digital baseband signal $r_1$. Because the baseband processor 140 requires high-resolution digital baseband signals to perform channel estimation, the first digital baseband signal $r_1$ is suitable for providing to the baseband processor 140 to perform channel estimation. Accordingly, the first digital baseband signal $r_1$ corresponding to the second analog-to-digital converter 1301 is suitable for performing channel estimation on analog radio frequency signal of specific receiving antenna (for example, the analog radio frequency signal $x_1$ of specific receiving antenna 101).

In the third embodiment, the receiver device 10 determines the resolution of the second analog-to-digital converter 1301 according to demands on performing channel estimation, i.e. determining the value of K. For example, when the receiver device 10 requires higher resolution first digital baseband signal $r_1$, the analog-to-digital conversion controller 150 changes the converter configurable information (ACI) so that the number of first analog-to-digital converters contained in the second analog-to-digital converter 1301 raises from 3 to 5.

Figure 4:
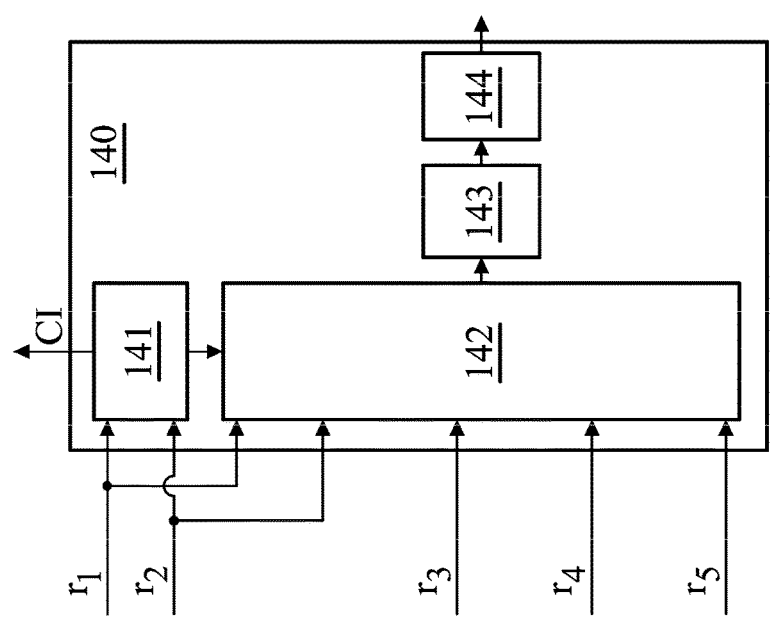
FIG. 4 shows a configuration diagram of the baseband processor 140 according to a fourth embodiment of the present disclosure.

FIG. 4 shows a configuration diagram of the baseband processor 140 according to a fourth embodiment of the present disclosure. In the fourth embodiment, the baseband processor 140 comprises a channel estimation unit 141, a data detection unit 142, a demodulation unit 143, and a decoder 144. The data detection unit 142 is respectively connected to the channel estimation unit 141 and the demodulation unit 143. The demodulation unit 143 is connected to the decoder 144. In the fourth embodiment, the channel estimation unit 141 is used to receive the first digital baseband signals $r_1$, $r_2$ from the second analog-to-digital converters 1301 and 1302. The channel estimation unit 141 processes the first digital baseband signals $r_1$, $r_2$ to obtain the channel information (CI) and outputs the channel information (CI) to the analog-to-digital conversion controller 150. The data detection unit 142 uses the channel signals $h_1$-$h_n$ recently estimated by the channel estimation unit 141 to perform signal processing on the first digital baseband signals $r_1\sim r_S$.

In general, in the baseband processor 140, the required resolution for data detection is lower than the required resolution for channel estimation. For example, if the demodulation unit 143 is demodulating 64-QAM (Quadrature Amplitude Modulation) digital modulated signals, the data detection unit 142 needs a 6-bit resolution analog-to-digital converter. But relatively, the channel estimation unit 141 needs a 12-bit resolution analog-to-digital converter to estimate the channel effect on the 64-QAM digital modulated signals.

Accordingly, in the fourth embodiment, the data detection unit 142 uses output signals of both the first analog-to-digital converter and the second analog-to-digital converter to perform data detection. In other words, the data detection unit 142 performs data detection without taking resolution of the analog-to-digital converter into consideration. But the channel estimation unit 141 only uses output signals of high-resolution analog-to-digital converter (i.e. the second analog-to-digital converter) to perform channel estimation. Therefore how to configure the number and resolution of the second analog-to-digital converter in the configurable precision analog-to-digital converter 130 under different transmission situations becomes an important issue of the present disclosure.

FIGS. 5-7, FIGS. 8A-8C and FIGS. 9A-9C show configuration diagram of the switch device 120 and the configurable precision analog-to-digital converter 130 according to a fifth embodiment of the present disclosure. In the fifth embodiment, the analog-to-digital conversion controller 150 adjusts configurations of the switch device 120 and the configurable precision analog-to-digital converter 130 according to different channel information (CI). For ease of understanding, in the fifth embodiment, the first number (N) and second number (M) are respectively 5 and 9, i.e. the receiver device 10 has five receiving antennas 111~115 and nine first analog-to-digital converters 131~139. However, it should be understood that persons skilled in the art can easily change the number of receiving antennas and first analog-to-digital converters (i.e. the first number (N) and the second number (M)) according to the present disclosure.

Figure 5:
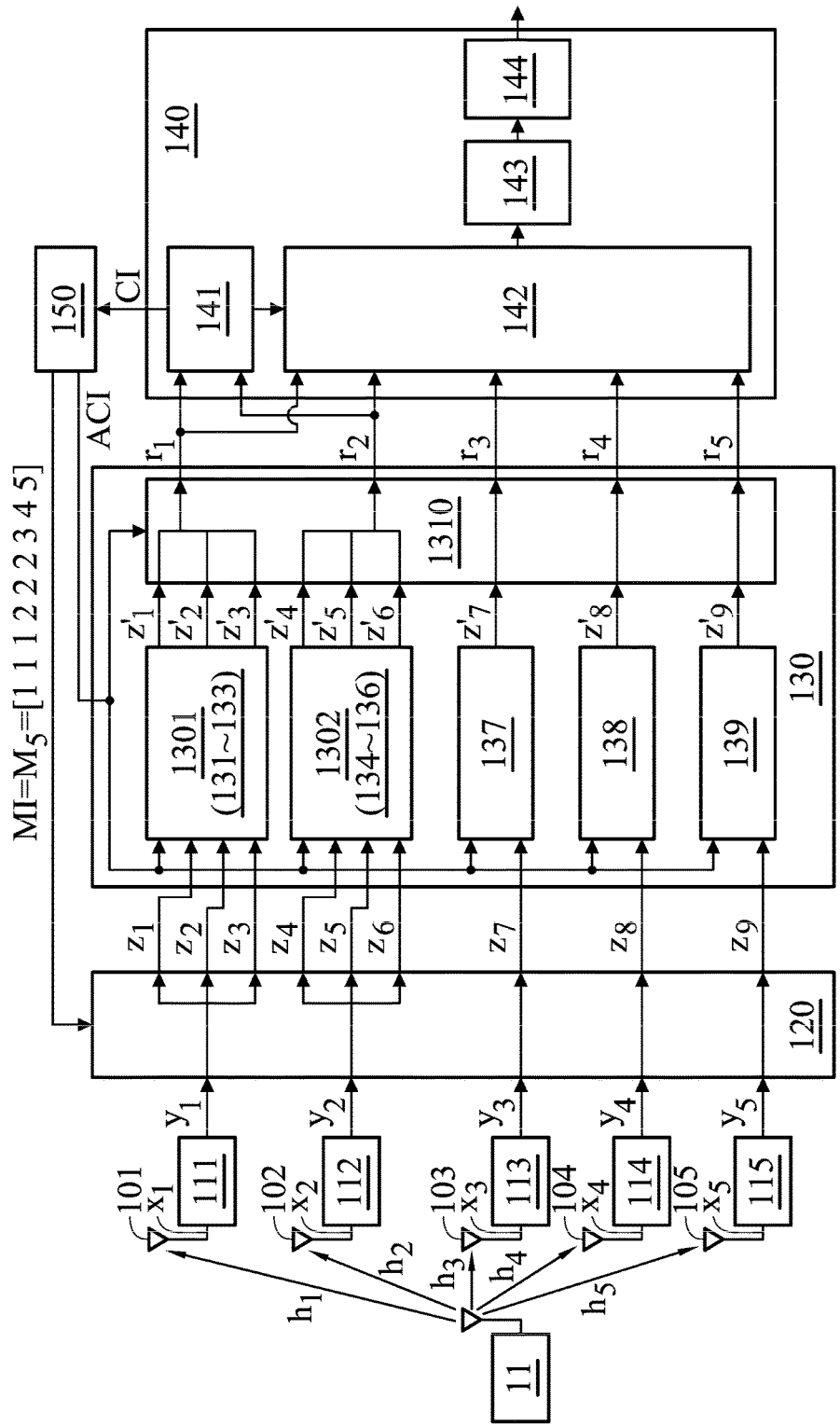
FIGS. 5-7 show configurations of the switch device 120 and the configurable precision analog-to-digital converter 130 in a training phase (first mode) according to a fifth embodiment of the present disclosure.
Figure 6:
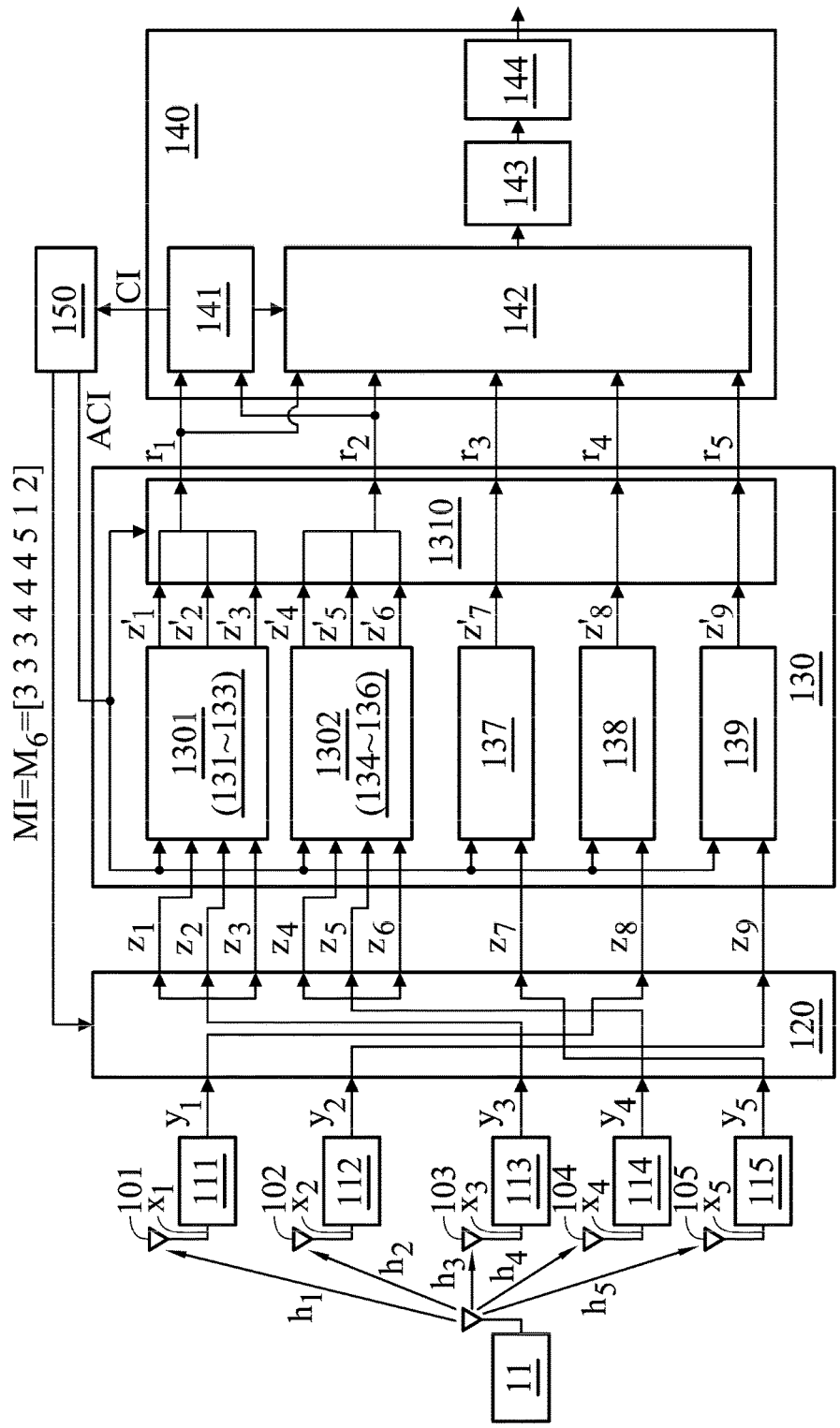
Figure 7:
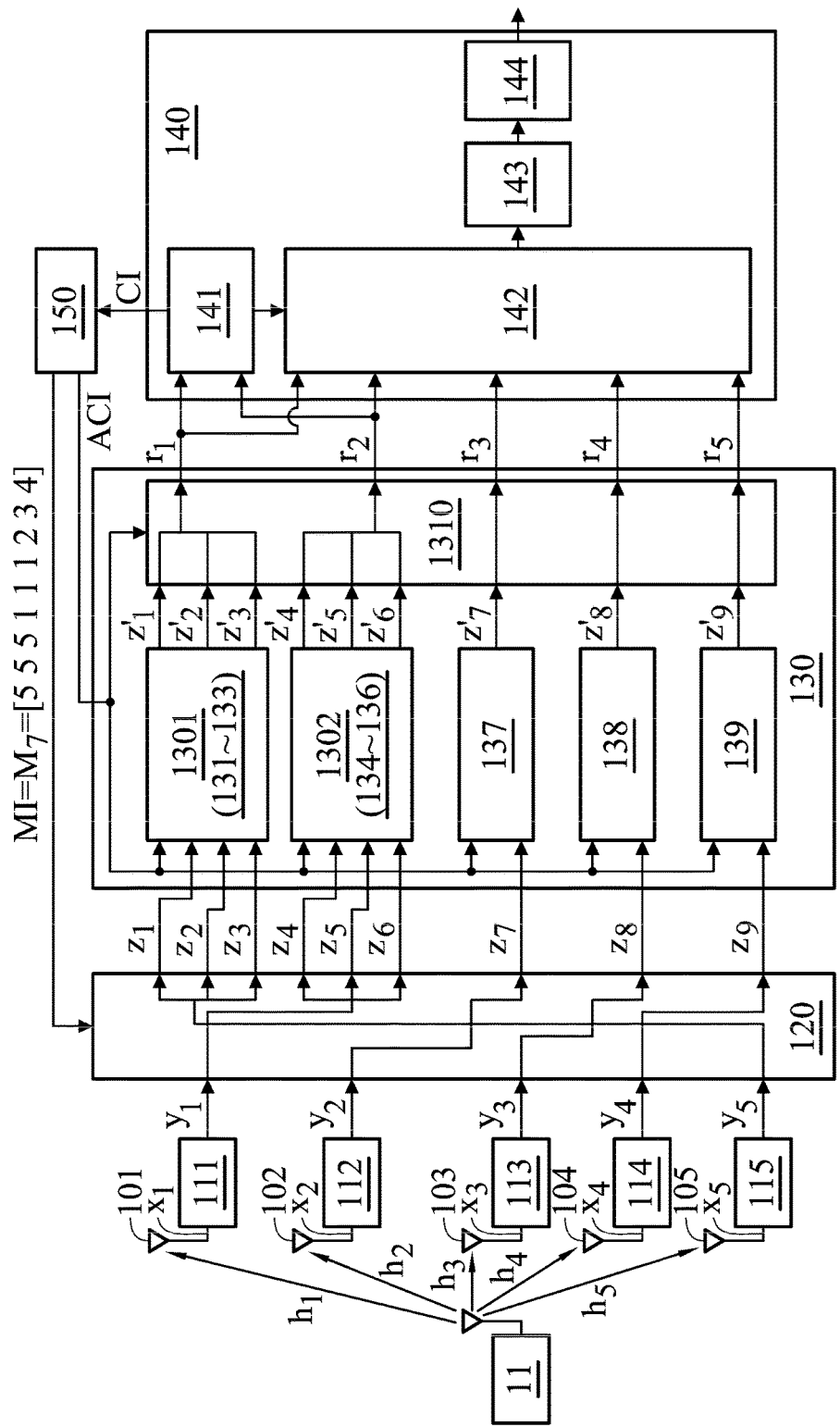

FIGS. 5-7 show configurations of the switch device 120 and the configurable precision analog-to-digital converter 130 in a training phase (first mode) according to a fifth embodiment of the present disclosure. In the fifth embodiment, when the analog-to-digital conversion controller 150 does not have the full channel statistical information (full CSI), the analog-to-digital conversion controller 150 informs the receiver device 10 being in the training phase.

When the receiver device 10 is in the training phase, the analog-to-digital conversion controller 150 periodically changes the mapping information (MI) so that the second analog-to-digital converters 1301 and 1302 in turn outputs the first digital baseband signals $r_j$ and $r_{j+1}$ corresponding to each two of the receiving antennas. Then the channel estimation unit 141 of the baseband processor 140 obtains the channel signals $h_j$ and $h_{j+1}$ (i.e. the channel information (CI)) according to the first digital baseband signals $r_j$ and $r_{j+1}$.

Refer to FIG. 5. The analog-to-digital conversion controller 150 does not have the full channel statistical information (full CSI), the analog-to-digital conversion controller 150 informs the receiver device 10 being in the training phase. At this time, in order to estimate the channel signals $h_1$ and $h_2$, the analog-to-digital conversion controller 150 simultaneously outputs a mapping vector $M_5$=[1,1,1,2,2,2, 3,4,5] (i.e., the mapping information (MI)) to the switch device 120 and the converter configurable information (ACI) to the configurable precision analog-to-digital converter 130. The switch device 120 processes the analog baseband signals $y_1$~$y_5$ to obtain the corresponding analog baseband signals $z_1$~$z_9$ according to the mapping vector $M_5$. More specifically, the switch device 120 provides three identical analog baseband signals $y_1$ as the corresponding analog baseband signals $z_1$~$z_3$ and provides three identical analog baseband signals $y_2$ as the corresponding analog baseband signals $z_4$~$z_6$ according to the mapping vector $M_5$. Similarly, the switch device 120 respectively provides the analog baseband signals $y_3$, $y_4$, $y_5$ as the corresponding analog baseband signals $z_7$, $z_8$, $z_9$ according to the mapping vector $M_5$. The configurable precision analog-to-digital converter 130 integrates/combines the first analog-to-digital converters 131~133 as the second analog-to-digital converter 1301 and integrates/combines the first analog-to-digital converters 134~136 as the second analog-to-digital converter 1302 according to the converter configurable information (ACI).

In FIG. 5, the corresponding analog baseband signals $z_1$~$z_3$ and the corresponding analog baseband signals $z_4$~$z_6$ are respectively input signals of the second analog-to-digital converters 1301 and 1302; on the contrary, the corresponding analog baseband signals $z_7$, $z_8$, $z_9$ are respectively input signals of the first analog-to-digital converters 137, 138, 139. In the fifth embodiment, the bit combiner 1310 integrates the second digital baseband signals $z_1'$~$z_3'$ outputted from the second analog-to-digital converter 1301 as a single first digital baseband signal $r_1$. Similarly, the bit combiner 1310 integrates the second digital baseband signals $z_4'$~$z_6'$ outputted from the second analog-to-digital converter 1301 as a single first digital baseband signal $r_2$. The bit combiner 1310 then outputs the first digital baseband signals $r_1$, $r_2$ to the channel estimation unit 141. Finally, the channel estimation unit 141 processes the first digital baseband signal $r_1$, $r_2$ to obtain the channel signals $h_1$, $h_2$.

Refer to FIG. 6. The analog-to-digital conversion controller 150 still does not have the full channel statistical information (full CSI), and the receiver device 10 is also in the training phase. At this time, in order to estimate the channel signals $h_3$ and $h_4$, the analog-to-digital conversion controller 150 simultaneously outputs a mapping vector $M_6$=[3,3,3,4,4,4,5,1,2] to the switch device 120 and the converter configurable information (ACI) to the configurable precision analog-to-digital converter 130. The switch device 120 provides three identical analog baseband signals $y_3$ as the corresponding analog baseband signals $z_1$~$z_3$ and provides three identical analog baseband signals $y_4$ as the corresponding analog baseband signals $z_4$~$z_6$ according to the mapping vector $M_6$. Similarly, the switch device 120 respectively provides the analog baseband signals $y_5$, $y_1$, $y_2$ as the corresponding analog baseband signals $z_7$, $z_8$, $z_9$ according to the mapping vector $M_6$. The configurable precision analog-to-digital converter 130 integrates/combines the first analog-to-digital converters 131~133 as the second analog-to-digital converter 1301 and integrates/combines the first analog-to-digital converters 134~136 as the second analog-to-digital converter 1302 according to the converter configurable information (ACI).

In FIG. 6, the corresponding analog baseband signals $z_1$~$z_3$ and the corresponding analog baseband signals $z_4$~$z_6$ are respectively input signals of the second analog-to-digital converters 1301 and 1302; on the contrary, the corresponding analog baseband signals $z_7$, $z_8$, $z_9$ are respectively input signals of the first analog-to-digital converters 137, 138, 139. In the fifth embodiment, the bit combiner 1310 integrates the second digital baseband signals $z_1'$~$z_3'$ outputted from the second analog-to-digital converter 1301 as single first digital baseband signal $r_1$. Similarly, the bit combiner 1310 integrates the second digital baseband signals $z_4'$~$z_6'$ outputted from the second analog-to-digital converter 1301 as single first digital baseband signal $r_2$. The bit combiner 1310 then outputs the first digital baseband signals $r_1$, $r_2$ to the channel estimation unit 141. Finally, the channel estimation unit 141 processes the first digital baseband signal $r_1$, $r_2$ to obtain the channel signals $h_3$, $h_4$.

Refer to FIG. 7, the analog-to-digital conversion controller 150 still does not have the full channel statistical information (full CSI), the receiver device 10 is also in the training phase. At this time, in order to estimate the channel signals $h_5$ and $h_1$, the analog-to-digital conversion controller 150 simultaneously outputs a mapping vector $M_7$=[5,5,5,1, 1,1,2,3,4] to the switch device 120 and the converter configurable information (ACI) to the configurable precision analog-to-digital converter 130. The switch device 120 provides three identical analog baseband signals $y_5$ as the corresponding analog baseband signals $z_1$~$z_3$ and provides three identical analog baseband signals $y_1$ as the corresponding analog baseband signals $z_4$~$z_6$ according to the mapping vector $M_7$. Similarly, the switch device 120 respectively provides the analog baseband signals $y_2$, $y_3$, $y_4$ as the corresponding analog baseband signals $z_7$, $z_8$, $z_9$ according to the mapping vector $M_7$. The configurable precision analog-to-digital converter 130 integrates/combines the first analog-to-digital converters 131~133 as the second analog-to-digital converter 1301 and integrates/combines the first analog-to-digital converters 134~136 as the second analog-to-digital converter 1302 according to the converter configurable information (ACI).

In FIG. 7, the corresponding analog baseband signals $z_1$~$z_3$ and the corresponding analog baseband signals $z_4$~$z_6$ are respectively input signals of the second analog-to-digital converters 1301 and 1302; on the contrary, the corresponding analog baseband signals $z_7$, $z_8$, $z_9$ are respectively input signals of the first analog-to-digital converters 137, 138, 139. In the fifth embodiment, the bit combiner 1310 integrates the second digital baseband signals $z_1'$~$z_3'$ outputted from the second analog-to-digital converter 1301 as a single first digital baseband signal $r_1$. Similarly, the bit combiner 1310 integrates the second digital baseband signals $z_4'$~$z_6'$ outputted from the second analog-to-digital converter 1301 as a single first digital baseband signal $r_2$. The bit combiner 1310 then outputs the first digital baseband signals $r_1$, $r_2$ to the channel estimation unit 141. Finally, the channel estimation unit 141 processes the first digital baseband signal $r_1$, $r_2$ to obtain the channel signals $h_5$, $h_1$.

In the fifth embodiment, the channel estimation unit 141 sequentially obtains the channel signals $h_1 \sim h_5$ through the control method of the analog-to-digital conversion controller 150 shown in FIGS. 5-7. Then the channel estimation unit 141 processes the channel signals $h_1 \sim h_5$ to obtain the full channel statistical information (full CSI) and outputs the full channel statistical information (full CSI) to the analog-to-digital conversion controller 150. Herein the fifth embodiment also comprises outputting, by the channel estimation unit 141, the channel signals $h_1 \sim h_5$ to the analog-to-digital conversion controller 150. Then the analog-to-digital conversion controller 150 processes the channel signals $h_1 \sim h_5$ to obtain the full channel statistical information (full CSI). When the analog-to-digital conversion controller 150 obtains the full channel statistical information (full CSI), the analog-to-digital conversion controller 150 informs the receiver device 10 being in a non-training phase (second mode).

FIGS. 8A-8C and FIGS. 9A-9C show configurations of the switch device 120 and the configurable precision analog-to-digital converter 130 in a non-training phase (second mode) according to the fifth embodiment of the present disclosure. In the fifth embodiment, when the analog-to-digital conversion controller 150 obtains the full channel statistical information (full CSI), the analog-to-digital conversion controller informs the receiver device being in the non-training phase. The receiver device 10 is in the non-training phase, the analog-to-digital conversion controller 150 adjusts, according to the full channel statistical information (full CSI), the mapping information (MI) and the converter configurable information (ACI) to change configuration of the configurable precision analog-to-digital converter 130.

Figure 8A:
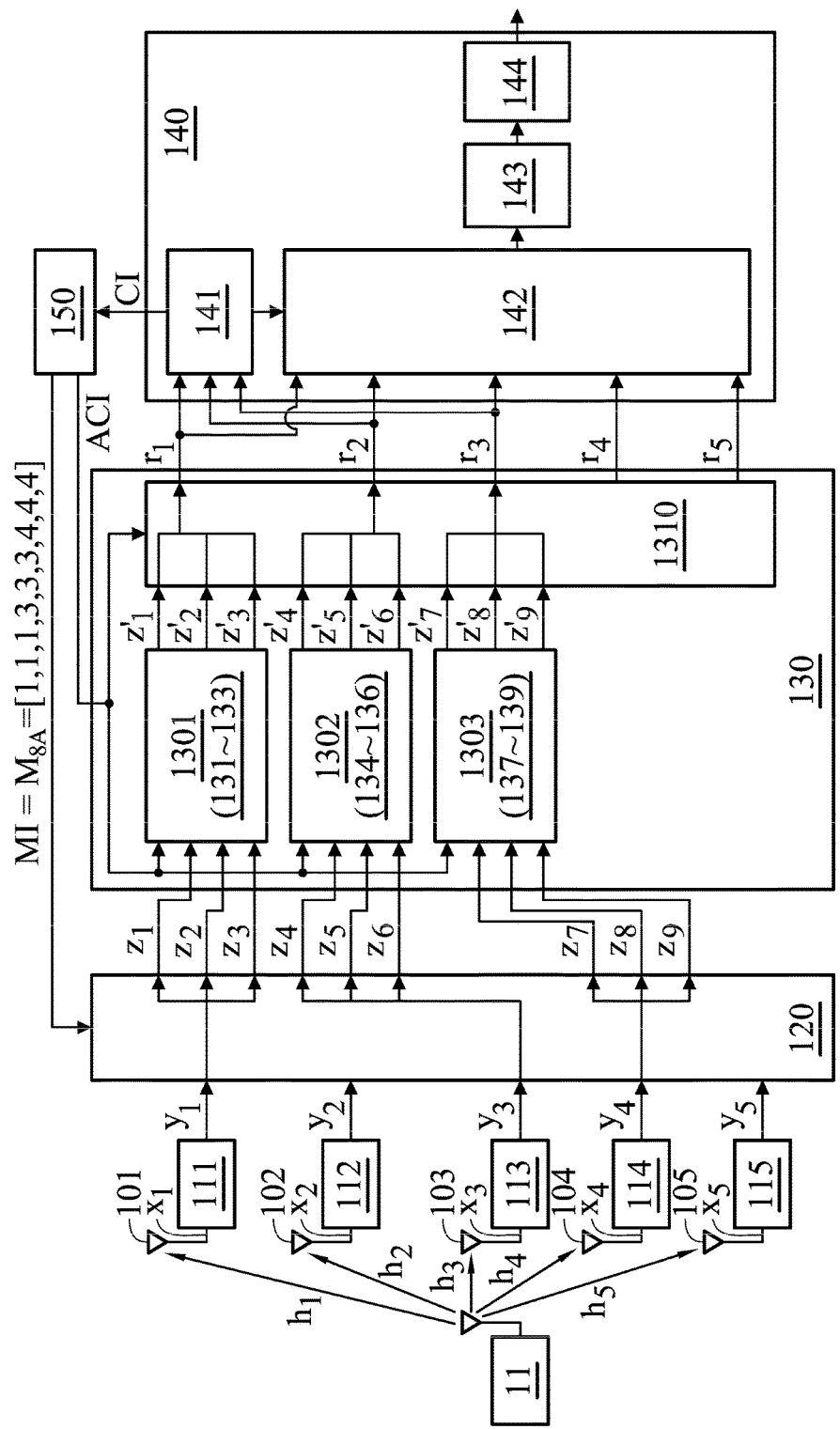
FIGS. 8A-8C and FIGS. 9A-9C show configurations of the switch device 120 and the configurable precision analog-to-digital converter 130 in a non-training phase (second mode) according to the fifth embodiment of the present disclosure.

Refer to FIG. 8A. In the fifth embodiment, when the analog-to-digital conversion controller 150 obtains that a current channel changing rate is fast (i.e. short coherence time) according to the full channel statistical information (full CSI), the analog-to-digital conversion controller 150 changes the converter configurable information (ACI) so that the configurable precision analog-to-digital converter 130 increases the number of second analog-to-digital converters. For example, when the analog-to-digital conversion controller 150 obtains that a current channel changing rate exceeds a predetermined changing rate (or the current coherence time is lower than a predetermined coherence time), the analog-to-digital conversion controller 150 adjusts the mapping information (MI) and the converter configurable information (ACI) so that the configurable precision analog-to-digital converter 130 increases the number of second analog-to-digital converters.

Refer to FIG. 8A. In the fifth embodiment, the analog-to-digital conversion controller 150 changes the converter configurable information (ACI) so that the number of second analog-to-digital converters is increased to 3 (i.e. the second analog-to-digital converters 1301, 1302, and 1303). In the embodiment of FIG. 8A, the analog-to-digital conversion controller 150 further obtains that poor channel effect with the receiving antennas 102 and 105 according to the full channel statistical information (full CSI). At this time, the analog-to-digital conversion controller 150 thereby discards some of receiving antennas having a poor channel effect (the receiving antennas 102 and 105) by changing the mapping information (MI). In other words, the analog-to-digital conversion controller 150 outputs a mapping vector $M_{8A}$=[1,1,1,3,3,3,4,4,4] to the switch device 120. The switch device 120 provides three identical analog baseband signals $y_1$ as the corresponding analog baseband signals $z_1 \sim z_3$, provides three identical analog baseband signals $y_3$ as the corresponding analog baseband signals $z_4 \sim z_6$, and provides three identical analog baseband signals $y_4$ as the corresponding analog baseband signals $z_7 \sim z_9$ according to the mapping vector $M_{8A}$.

Refer to FIG. 8A. In the fifth embodiment, the corresponding identical analog baseband signals $z_1 \sim z_3$, the corresponding identical analog baseband signals $z_4 \sim z_6$, and the corresponding identical analog baseband signals $z_7 \sim z_9$ are respectively input signals of the second analog-to-digital converters 1301, 1302 and 1303. In the fifth embodiment, the bit combiner 1310 respectively integrates the second digital baseband signals $z_1' \sim z_3'$, $z_4' \sim z_6'$, and $z_7' \sim z_9'$ outputted from the second analog-to-digital converters 1301, 1302 and 1303 as the first digital baseband signals $r_1$, $r_2$, $r_3$. Then the bit combiner 1310 outputs the first digital baseband signal $r_1$, $r_2$, $r_3$ to the channel estimation unit 141. Finally, the channel estimation unit 141 processes the first digital baseband signals $r_1$, $r_2$, $r_3$ to obtain the channel signals $h_1$, $h_3$, $h_4$.

Compared to the configurable precision analog-to-digital converter 130 shown in FIGS. 5-7, the configurable precision analog-to-digital converter 130 shown in FIG. 8A can obtains the channel signals $h_1 \sim h_5$ more quickly. Accordingly, the configurable precision analog-to-digital converter 130 shown in FIG. 8A is suitable for transmission channels with high channel changing rate (i.e., short coherence time). As shown in FIG. 8A, in consideration of situations marked by high channel changing rates, the analog-to-digital conversion controller 150 discards receiving antennas having a poor channel effect to exchange more accuracy on channel estimation.

Figure 8B:
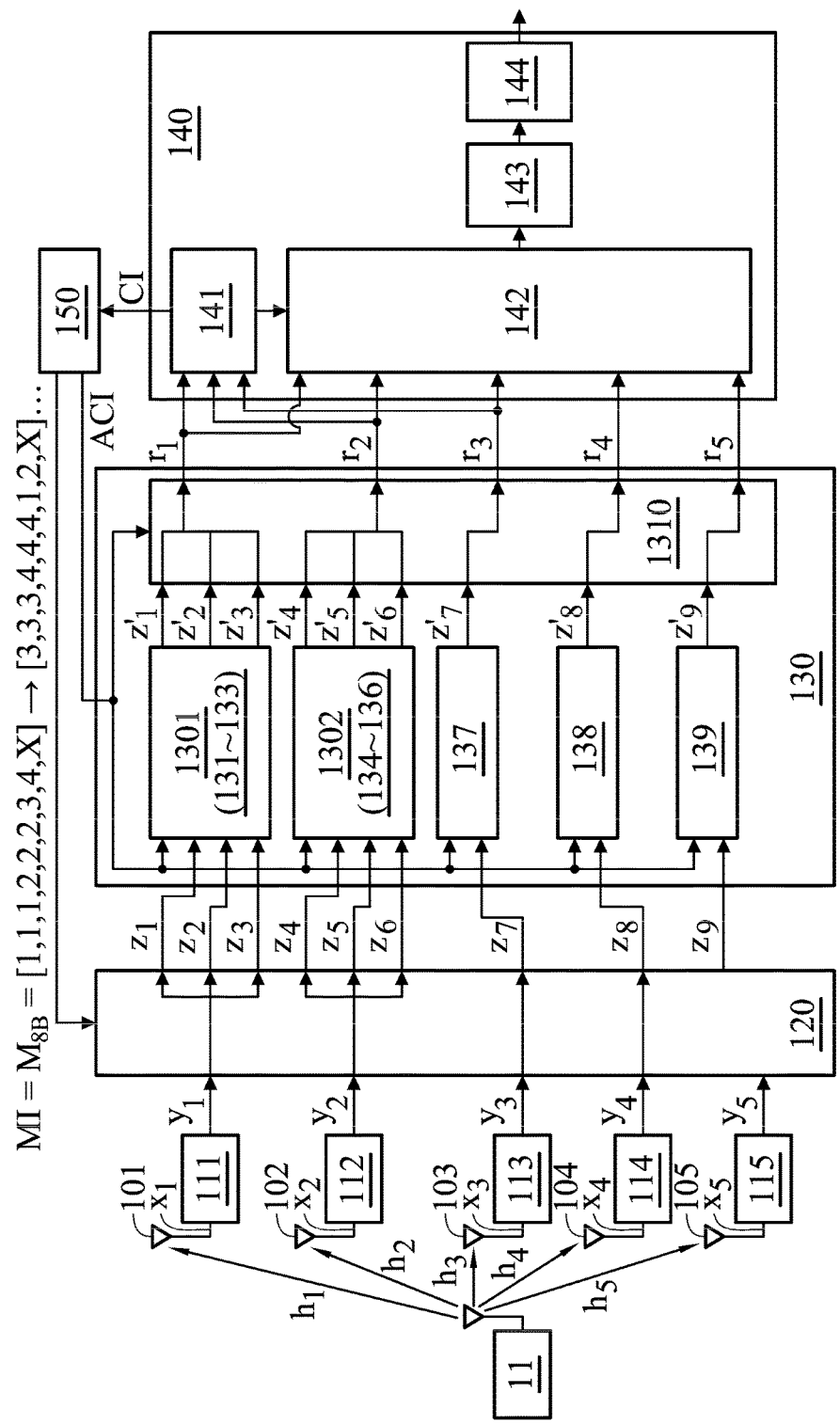

Refer to FIG. 8B. In the fifth embodiment, when the analog-to-digital conversion controller 150 obtains that a current channel changing rate is fast (i.e. short coherence time) according to the full CSI, the analog-to-digital conversion controller 150 changes the converter configurable information (ACI) and the mapping information (MI) to increase a frequency of channel estimation of the receiving antennas. Comparing with FIG. 8A, the analog-to-digital conversion controller 150 in FIG. 8B does not increases the number of the second analog-to-digital converters in the configurable precision analog-to-digital converter 130. The configurable precision analog-to-digital converter 130 in FIG. 8B still remains a same configuration with the configurable precision analog-to-digital converter 130 in the training phase in FIGS. 5-7.

In FIG. 8B, the analog-to-digital conversion controller 150 obtains that the receiving antenna 105 has the worst channel effect from the full CSI. At this time, in order to increase the frequency of channel estimation of the receiving antennas, the analog-to-digital conversion controller 150 only changes the mapping information (MI) to discard the receiving antenna 105. In other words, in a coherence time, the analog-to-digital conversion controller 150 sequentially outputs mapping vectors $M_{8B}$=[1,1,1,2,2,2,3,4,X]→[3,3,3,4,4,4,1,2,X]→[1,1,1,2,2,2,3,4,X]→[3,3,3,4,4,4,1,2,X] . . . to the switch device 120, wherein X means the switch device 120 discards the baseband analog signal $y_5$ from the receiving antenna 105.

The switch device 120 provides three identical analog baseband signals $y_1$ as the corresponding analog baseband signals $z_1 \sim z_3$, provides three identical analog baseband signals $y_2$ as the corresponding analog baseband signals $z_4 \sim z_6$, and provides the analog baseband signals $y_3$, $y_4$ as the corresponding analog baseband signals $z_7$, $z_8$ according to the mapping vector $M_{8B}$=[1,1,1,2,2,2,3,4,X].

Refer to FIG. 8B. In the fifth embodiment, the corresponding identical analog baseband signals $z_1 \sim z_3$, the corresponding identical analog baseband signals $z_4 \sim z_6$, the corresponding analog baseband signal $z_7$, and the corresponding analog baseband signal $z_8$ are respectively input signals of the second analog-to-digital converters 1301, 1302 and the first analog-to-digital converters 137, 138. The bit combiner 1310 respectively integrates the second digital baseband signals $z_1' \sim z_3'$ and $z_4' \sim z_6'$ outputted from the second analog-to-digital converters 1301 and 1302 as the first digital baseband signals $r_1$, $r_2$ and outputs the second digital baseband signals $z_7'$, $z_8'$ as the first digital baseband signals $r_3$, $r_4$. Then the bit combiner 1310 outputs the first digital baseband signals $r_1$, $r_2$ to the channel estimation unit 141. Finally, the channel estimation unit 141 processes the first digital baseband signals $r_1$, $r_2$ to obtain the channel signals $h_1$, $h_2$ corresponding to the receiving antennas 101 and 102. Then the switch device 120 receives the mapping vectors $M_{8B}$=[3,3,3,4,4,4,1,2,X], and the channel estimation unit 141 processes the first digital baseband signals $r_1$, $r_2$ to obtain the channel signals $h_3$, $h_4$ corresponding to the receiving antennas 103 and 104.

Refer to FIG. 8B. Because the analog-to-digital conversion controller 150 discards the baseband analog signal $y_5$ from the receiving antenna 105, the analog-to-digital conversion controller 150 only needs two mapping vectors (i.e. [1,1,1,2,2,2,3,4,X] and [3,3,3,4,4,4,1,2,X]) to obtains the first digital baseband signals $r_1$, $r_2$ corresponding to all of the receiving antennas 101~104. As a result, the analog-to-digital conversion controller 150 changes the converter configurable information (ACI) and the mapping information (MI) to discard receiving antenna 105 so that the frequency of channel estimation of the receiving antennas increases.

Figure 8C:
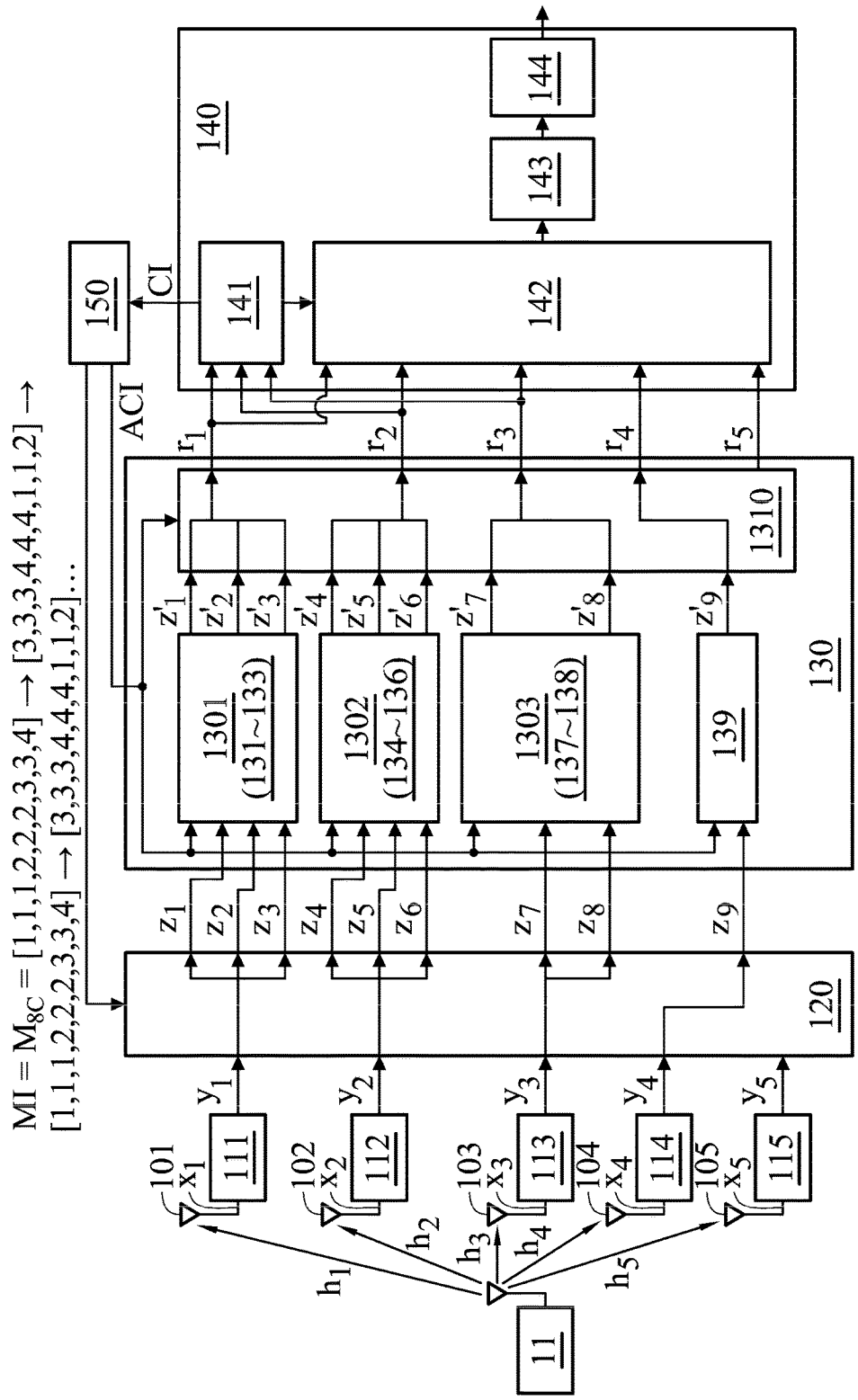

Refer to FIG. 8C. In the fifth embodiment, when the analog-to-digital conversion controller 150 obtains that a current channel changing rate is fast (i.e. short coherence time) according to the full CSI, the analog-to-digital conversion controller 150 changes the converter configurable information (ACI) and the mapping information (MI) to increase a frequency of channel estimation of the receiving antennas. In addition, in FIG. 8C, the analog-to-digital conversion controller 150 also obtains that the receiving antenna 105 has the worst channel effect from the full CSI. Similar to FIG. 8B, the configurable precision analog-to-digital converter 130 in FIG. 8C still remains a configuration of the second analog-to-digital converters 1301, 1302, and the analog-to-digital conversion controller 150 also changes the mapping information (MI) to discard the receiving antenna 105. The main difference between FIG. 8B and FIG. 8C is the analog-to-digital conversion controller 150 changes the converter configurable information (ACI) to form a second analog-to-digital converter 1303. In FIG. 8C, the second analog-to-digital converter 1303 is composed by the first analog-to-digital converters 137 and 138, and the second analog-to-digital converter 1303 is only used for proving a first digital baseband signals $r_3$ which has a higher resolution than the first digital baseband signals $r_3$ in FIG. 8B to the data detection unit 142.

In FIG. 8C, in a coherence time, the analog-to-digital conversion controller 150 sequentially outputs mapping vectors $M_{8C}$=[1,1,1,2,2,2,3,3,4]→[3,3,3,4,4,4,1,1,2]→[1,1,1,2,2,2,3,3,4]→[3,3,3,4,4,4,1,1,2] . . . to the switch device 120. Similar to FIG. 8B, the analog-to-digital conversion controller 150 in FIG. 8C also uses two mapping vectors (i.e. [1,1,1,2,2,2,3,3,4] and [3,3,3,4,4,4,1,1,2]) to obtains the first digital baseband signals $r_1$, $r_2$ corresponding to all of the receiving antennas 101~104. Comparing with the low-resolution analog-to-digital converter (the first analog-to-digital converter 137) shown in FIG. 8B, the low-resolution analog-to-digital converter (the second analog-to-digital converter 1303) shown in FIG. 8C have higher resolution. Therefore the configurable precision analog-to-digital converter 130 shown in FIG. 8C can provide the first digital baseband signal $r_3$ with less quantization error to the data detection unit 142.

Figure 9A:
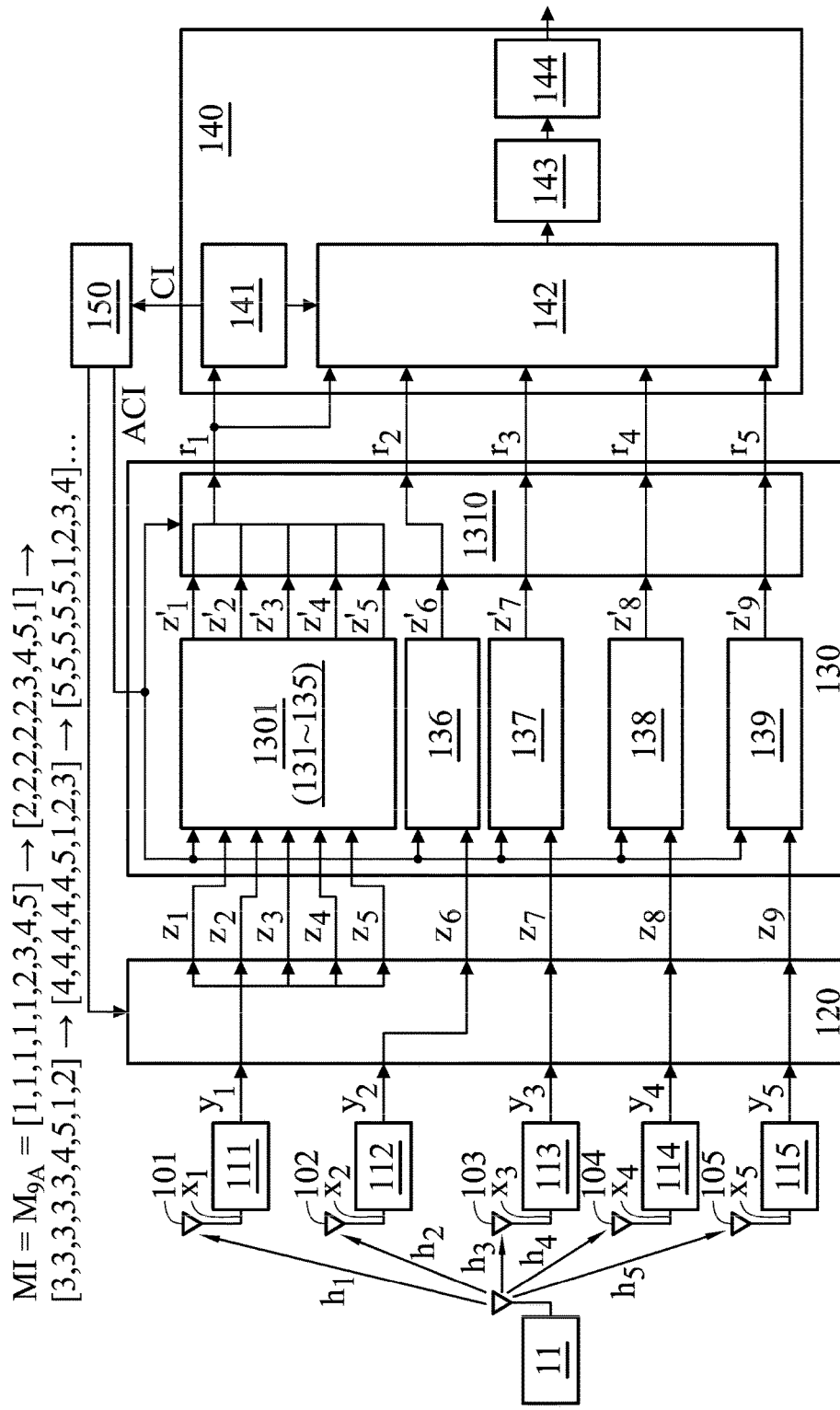

Refer to FIG. 9A. In the fifth embodiment, the analog-to-digital conversion controller 150 obtains that a current channel changing rate is slow (i.e. long coherence time) according to the full channel statistical information (full CSI), the analog-to-digital conversion controller 150 changes the converter configurable information (ACI) so that the configurable precision analog-to-digital converter 130 reduces the number of second analog-to-digital converters to one.

For example, when the analog-to-digital conversion controller 150 obtains that a current channel changing rate is lower a predetermined changing rate (or the current coherence time is longer than a predetermined coherence time), the analog-to-digital conversion controller 150 adjusts the mapping information (MI) and the converter configurable information (ACI) so that the configurable precision analog-to-digital converter 130 has only one second analog-to-digital converter. But the present disclosure is not limited thereto. In another embodiment of the present disclosure, when the analog-to-digital conversion controller 150 obtains that a current channel changing rate is slow (i.e. long coherence time) according to the full channel statistical information (full CSI), the analog-to-digital conversion controller 150 could maintain the number of second analog-to-digital converters of the configurable precision analog-to-digital converter 130. For example, the analog-to-digital conversion controller 150 maintains two second analog-to-digital converters in the configurable precision analog-to-digital converter 130 as the default configuration shown in FIG. 7.

Refer to FIG. 9A of the fifth embodiment, the configurable precision analog-to-digital converter 130 has only one second analog-to-digital converter so the second analog-to-digital converter can be assigned more first analog-to-digital converters. At this time, the analog-to-digital conversion controller 150 increases the number of first analog-to-digital converters composed in the single second analog-to-digital converter. i.e., increasing the resolution of the single second analog-to-digital converter. Increasing the resolution of the single second analog-to-digital converter contributes to reduce the quantization error of analog-to-digital converter so that the channel estimation unit 141 can more accurately estimate the channel signal $h_3$. At this time, the analog-to-digital conversion controller 150 periodically changes the mapping information (MI) so that the second analog-to-digital converter 1301 in turn outputs the first digital baseband signal $r_1$ corresponding to each of the receiving antennas 101~105. Finally, the channel estimation unit 141 processes each of the corresponding first digital baseband signals $r_1$ to obtain all of the channel signals $h_1 \sim h_5$.

Refer to FIG. 9A of the fifth embodiment, the analog-to-digital conversion controller 150 reduces the number of second analog-to-digital converters of the configurable precision analog-to-digital converter 130 to one (i.e., the second analog-to-digital converter 1301) by changing the mapping information (MI) and enhances the resolution of the second analog-to-digital converter (increasing the number of first analog-to-digital converters composed in the second analog-to-digital converter 1301). Accordingly, in the fifth embodiment shown in FIG. 9A, the second analog-to-digital converter 1301 is consisting of five first analog-to-digital converters 131~135. Compared to the second analog-to-digital converter 1301 having only three first analog-to-digital converters, the second analog-to-digital converter 1301 shown in FIG. 9A has higher resolution and thereby reduces the quantization error of the second analog-to-digital converter 1301. Simultaneously, the analog-to-digital conversion controller 150 outputs a mapping vector $M_{9A}$=[1,1,1,1,1,2,3,4,5] to the switch device 120. The switch device 120 provides five identical analog baseband signals $y_1$ as the corresponding analog baseband signals $z_1 \sim z_5$ and respectively provides the analog baseband signals $y_2$, $y_3$, $y_4$, $y_5$ as the corresponding analog baseband signals $z_6$, $z_7$, $z_8$, $z_9$ according to the mapping vector $M_{9A}$.

Refer to FIG. 9A of the fifth embodiment, the corresponding identical analog baseband signals $z_1 \sim z_5$ are input signals of the high-resolution second analog-to-digital converter 1301. In the fifth embodiment, the bit combiner 1310 integrates the second digital baseband signals $z_1' \sim z_5'$ outputted from the second analog-to-digital converter 1301 as the first digital baseband signal $r_1$. Then the bit combiner 1310 outputs the first digital baseband signal $r_1$ to the channel estimation unit 141. The channel estimation unit 141 processes the first digital baseband signal $r_1$ to obtain the channel signal $h_1$. Similarly, in a coherence time, the analog-to-digital conversion controller 150 sequentially outputs the mapping vectors $M_{9A}$=[2,2,2,2,2,3,4,5,1]→[3,3,3,3,3,4,5,1,2]→[4,4,4,4,4,5,1,2,3]→[5,5,5,5,5,1,2,3,4] . . . to the switch device 120 to obtain corresponding channel signals $h_2$, $h_3$, $h_4$, $h_5$.

Compared to the configurable precision analog-to-digital converter 130 shown in FIGS. 5-7, the configurable precision analog-to-digital converter 130 shown in FIG. 9A can obtain the channel signals $h_1 \sim h_5$ with less quantization error (i.e., obtains more accurate channel information (CI)). Accordingly, the configurable precision analog-to-digital converter 130 shown in FIG. 9A is suitable for transmission channels with slow channel changing rate (i.e., long coherence time). As shown in FIG. 9A, in consideration of situation of slow channel changing rate (i.e., long coherence time), the analog-to-digital conversion controller 150 takes advantage of the characteristic of long coherence time transmission channel to obtain more accurate channel information (CI).

Figure 9B:
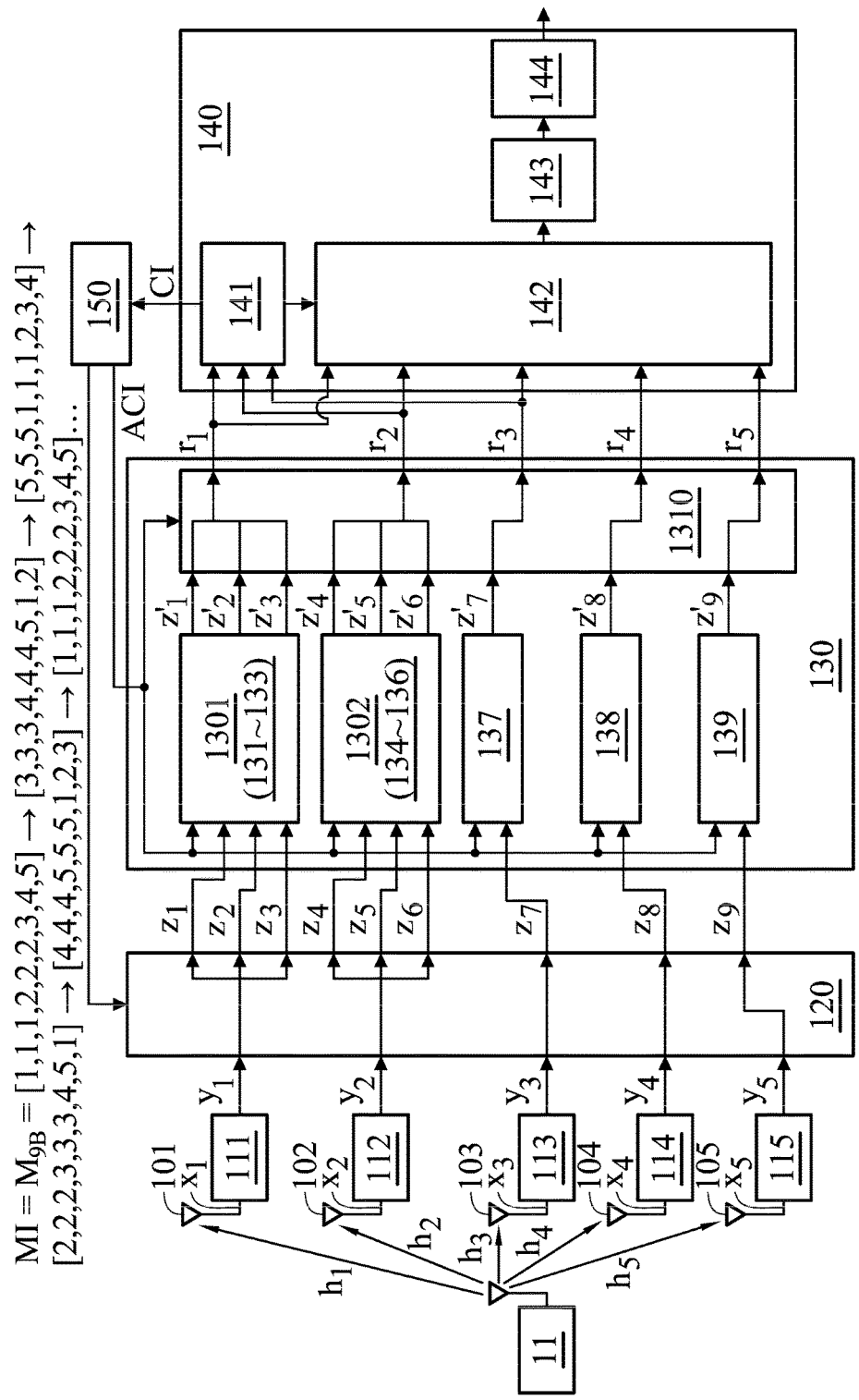

Refer to FIG. 9B of the fifth embodiment, the analog-to-digital conversion controller 150 obtains that a current channel changing rate is slow (i.e. long coherence time) according to the full CSI, the analog-to-digital conversion controller 150 does not change the converter configurable information (ACI) so that the configurable precision analog-to-digital converter 130 in FIG. 9B still remains a same configuration with the configurable precision analog-to-digital converter 130 in the training phase in FIGS. 5-7.

In FIG. 9B, in a coherence time, the analog-to-digital conversion controller 150 sequentially outputs mapping vectors $M_{9B}$=[1,1,1,2,2,2,3,4,5]→[3,3,3,4,4,4,5,1,2]→[5,5,5,1,1,1,2,3,4]→[2,2,2,3,3,3,4,5,1]→[4,4,4,5,5,5,1,2,3]→[1,1,1,2,2,2,3,4,5] . . . to the switch device 120. Then the channel estimation unit 141 sequentially obtains the channel signals $h_1 \sim h_2 \rightarrow h_3 \sim h_4 \rightarrow h_5 \sim h_1 \sim h_2 \sim h_3 \rightarrow h_4 \sim h_5$ according to the first digital baseband signals $r_1$, $r_2$ from the second analog-to-digital converters 1301 and 1302.

Figure 9C:
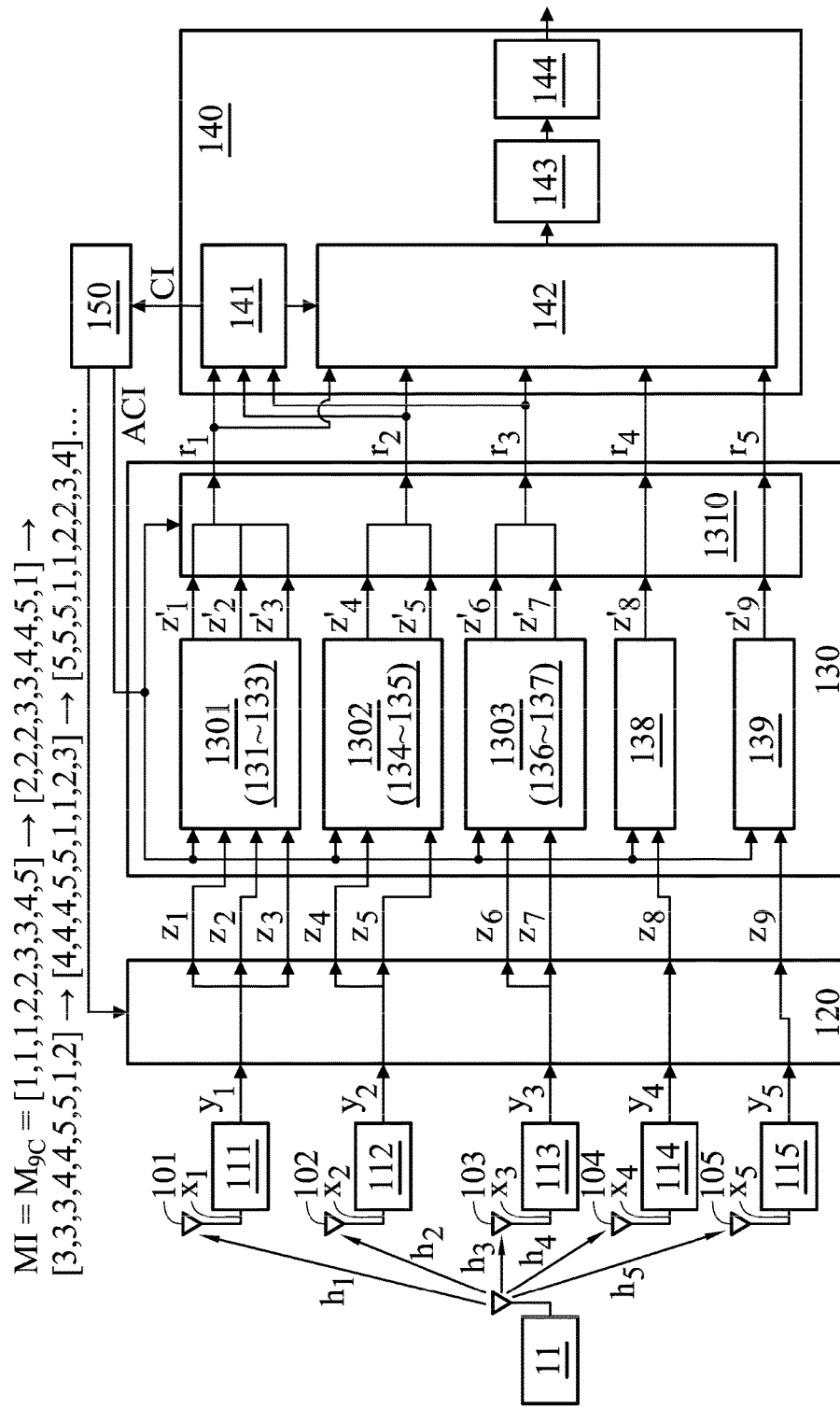

Refer to FIG. 9C of the fifth embodiment, the analog-to-digital conversion controller 150 obtains that a current channel changing rate is slow (i.e. long coherence time) according to the full CSI, the analog-to-digital conversion controller 150 changes the converter configurable information (ACI) so that the number of the highest resolution analog-to-digital converter of the configurable precision analog-to-digital converter 130 reduces to one and resolutions of analog-to-digital converters only used for data detection in the configurable precision analog-to-digital converter 130 are enhanced. For example, when the analog-to-digital conversion controller 150 obtains that a current channel changing rate is lower a predetermined changing rate (or the current coherence time is longer than a predetermined coherence time), the analog-to-digital conversion controller 150 adjusts the mapping information (MI) and the converter configurable information (ACI) so that the configurable precision analog-to-digital converter 130 has only one second analog-to-digital converter 1301 for channel estimation and has four analog-to-digital converters 1302, 1303, 138 and 139 which are only used for data detection, wherein the analog-to-digital converters 1302 is composed by the first analog-to-digital converters 134 and 135, and the analog-to-digital converter 1303 is composed by the first analog-to-digital converters 136 and 137.

Refer to FIG. 9C. In a coherence time, the analog-to-digital conversion controller 150 sequentially outputs mapping vectors $M_{9C}$=[1,1,1,2,2,3,3,4,5]→[2,2,2,3,3,4,4,5,1]→[3,3,3,4,4,5,5,1,2]→[4,4,4,5,5,1,1,2,3]→[5,5,5,1,1,2,2,3,4] . . . to the switch device 120. The switch device 120 provides three identical analog baseband signals $y_1$ as the corresponding analog baseband signals $z_1 \sim z_3$, provides two identical analog baseband signals $y_2$ as the corresponding analog baseband signals $z_4 \sim z_5$, provides two identical analog baseband signals $y_3$ as the corresponding analog baseband signals $z_6 \sim z_7$, provides the analog baseband signals $y_4$ as the corresponding analog baseband signals $z_8$, and provides the analog baseband signals $y_5$ as the corresponding analog baseband signals $z_9$ according to the mapping vector $M_{9C}$=[1,1,1,2,2,3,3,4,5]. The corresponding identical analog baseband signals $z_1 \sim z_3$, the corresponding identical analog baseband signals $z_4 \sim z_5$, the corresponding identical analog baseband signals $z_6 \sim z_7$, the corresponding analog baseband signal $z_8$, and the corresponding analog baseband signal $z_9$ are respectively input signals of the second analog-to-digital converter 1301 and the four analog-to-digital converters 1302, 1303, 138 and 139.

The bit combiner 1310 respectively integrates the second digital baseband signals $z_1' \sim z_3'$, $z_4' \sim z_5'$ and $z_6' \sim z_7'$ outputted from the second analog-to-digital converters 1301, 1302 and 1303 as the first digital baseband signals $r_1$, $r_2$, $r_3$, and outputs the second digital baseband signals $z_7'$, $z_8'$ as the first digital baseband signals $r_4$, $r_5$. Then the bit combiner 1310 outputs the first digital baseband signal $r_1$ to the channel estimation unit 141. The channel estimation unit 141 processes the first digital baseband signal $r_1$ to obtain the channel signal $h_1$ corresponding to the receiving antenna 101. The data detection unit 142 respectively uses the first digital baseband signals $r_1 \sim r_5$ for data detection. In similar, the channel estimation unit 141 sequentially obtains the channel signals $h_2$, $h_3$, $h_4$, $h_5$ corresponding to the analog baseband signals $y_2$, $y_3$, $y_4$, $y_5$, and the data detection unit 142 receives the first digital baseband signals $r_1 \sim r_5$ outputted from different resolutions analog-to-digital converters.

Comparing with low-resolution analog-to-digital converters (the first analog-to-digital converters 136 and 137) shown in FIG. 9A, low-resolution analog-to-digital converters (the second analog-to-digital converters 1302 and 1303) shown in FIG. 9C have higher resolution. Therefore the configurable precision analog-to-digital converter 130 shown in FIG. 9C can provide the first digital baseband signals $r_2$, $r_3$ with less quantization error to the data detection unit 142.

Because the analog-to-digital conversion controller 150 of the fifth embodiment changes configuration of the configurable precision analog-to-digital converter 130 according to the full channel statistical information (full CSI), the configurable precision analog-to-digital converter 130 shown in FIGS. 8A-8C and FIGS. 9A-9C can effectively combat fast-fading transmission channel.

In addition, when the channel estimation unit 141 cannot obtain the full channel statistical information (full CSI) of the current channel, the analog-to-digital conversion controller 150 informs the receiver device 10 switching from the non-training phase to the training phase for accelerating obtaining the full CSI. In addition, it is noticeable that the total number of low-resolution analog-to-digital converters (i.e. the first analog-to-digital converters) of the configurable precision analog-to-digital converter 130 is unchanged, wherein the analog-to-digital conversion controller 150 determines how many low-resolution analog-to-digital converters to be combined as high-resolution analog-to-digital converters (i.e. the second analog-to-digital converters). The analog-to-digital converter structure of the receiver device 10 of the present disclosure can only be implemented by low-resolution analog-to-digital converters and also changes its configuration of the low-resolution analog-to-digital converters according to current channel information (CI) or the full channel statistical information (full CSI). Therefore the receiver device 10 of the present disclosure can substantially reduce the power consumption of the applied electronic device without using any high-resolution analog-to-digital converters.

In addition, in another embodiment of the present disclosure, it is noticeable that, when the analog-to-digital conversion controller 150 obtains that a current channel changing rate is slow (i.e. long coherence time) according to the full channel statistical information (full CSI), the analog-to-digital conversion controller 150 maintains the number of second analog-to-digital converters in the configurable precision analog-to-digital converter 130 as the same as the default configuration (for example, it maintains two second analog-to-digital converters in the configurable precision analog-to-digital converter 130).

In addition, it is noticeable that the analog-to-digital conversion controller 150 also adjusts the mapping information (MI) and the converter configurable information (ACI) according to a decoding result of the baseband processor 140 so that the configurable precision analog-to-digital converter 130 increases a resolution of the second analog-to-digital converter. For example, when the analog-to-digital conversion controller 150 obtains that quantization error of the current signals are large through the decoding result of the demodulation unit 143, the analog-to-digital conversion controller 150 increases the resolution of the second analog-to-digital converter of the configurable precision analog-to-digital converter 130 to improve an accuracy of channel estimation.

Figure 10:
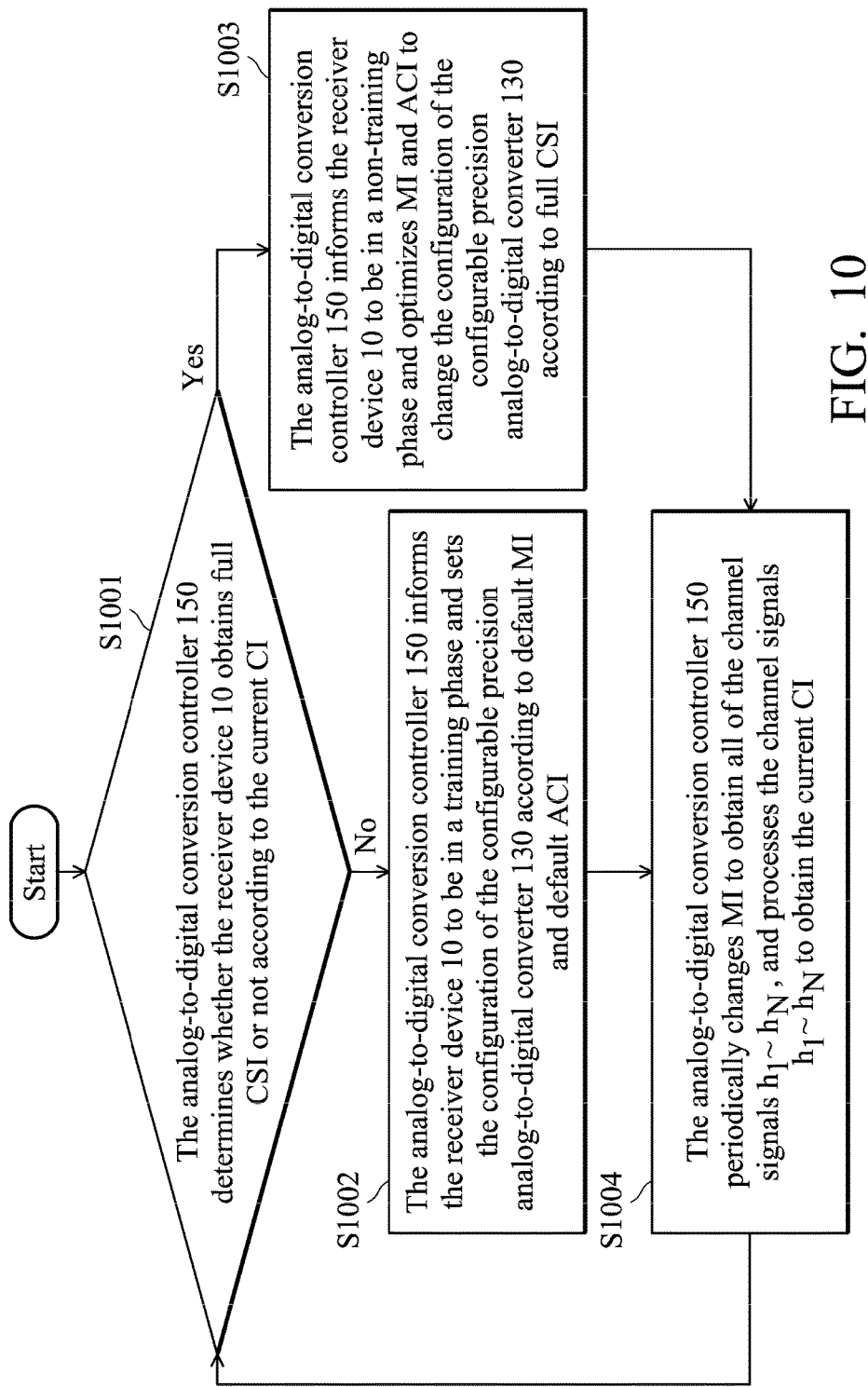
FIG. 10 shows a flow diagram of a control method applied to the configurable precision analog-to-digital converter 130 according to a sixth embodiment of the present disclosure.

FIG. 10 shows a flow diagram of a control method applied to the configurable precision analog-to-digital converter 130 according to a sixth embodiment of the present disclosure. In step S1001, the analog-to-digital conversion controller 150 determines whether the receiver device 10 obtains the full channel statistical information (full CSI) or not according to the current channel information (CI). If no, the method proceeds to step S1002; otherwise, the method proceeds to step S1003. In step S1002, the analog-to-digital conversion controller 150 informs the receiver device 10 to be in a training phase and sets the configuration of the configurable precision analog-to-digital converter 130 according to default mapping information (MI) and default converter configurable information (ACI). In step S1003, the analog-to-digital conversion controller 150 informs the receiver device 10 to be in a non-training phase and optimizes the mapping information (MI) and the converter configurable information (ACI) to change the configuration of the configurable precision analog-to-digital converter 130 according to the full channel statistical information (full CSI). In step S1004, the analog-to-digital conversion controller 150 periodically changes the mapping information (MI) to obtain all of the channel signals $h_1 \sim h_N$, and processes the channel signals $h_1 \sim h_N$ to obtain the current channel information (CI).

Figure 11:
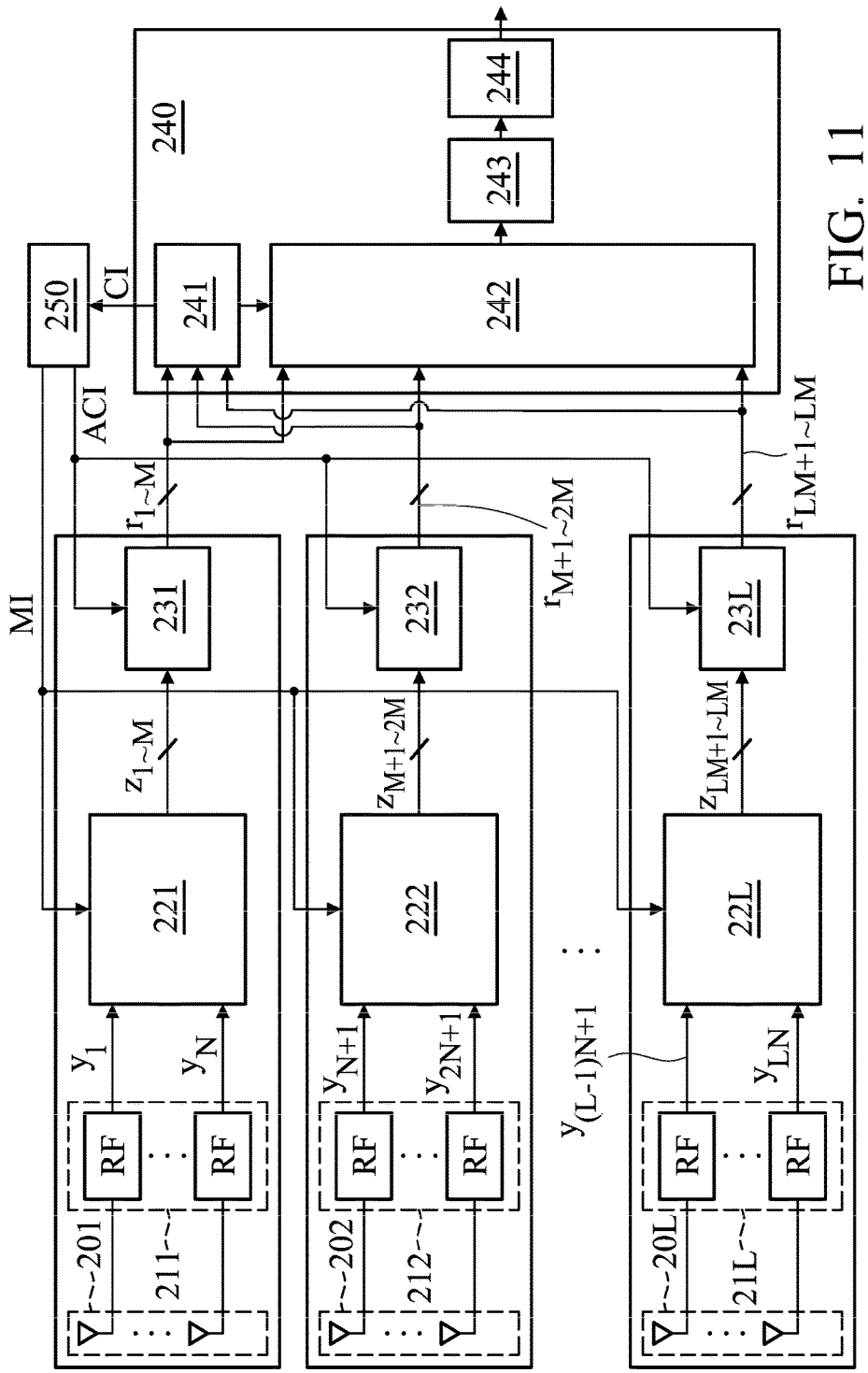
FIG. 11 shows a block diagram of a massive-antenna receiver device 20 used in a massive multi-input multi-output communication system according to a seventh embodiment of the present disclosure.

FIG. 11 shows a block diagram of a massive-antenna receiver device 20 used in a massive multi-input multi-output communication system according to a seventh embodiment of the present disclosure. In the seventh embodiment, the massive-antenna receiver device 20 comprises a plurality of receiving antenna sub-groups 201~20L, a plurality of radio frequency receiver sub-groups 211~21L, a plurality of switch devices 221~22L, a plurality of configurable precision analog-to-digital converters 231~23L, a baseband processor 240 and an analog-to-digital conversion controller 250. Each of the receiving antenna sub-groups 201~20L (for example, receiving antenna sub-group 201) comprises N receiving antennas. Each of the radio frequency receiver sub-groups 211~21L (for example, radio frequency receiver sub-group 211) comprises N radio frequency receiver.

In the seventh embodiment, the massive-antenna receiver device 20 controls L parallel modules by the single analog-to-digital conversion controller 250, wherein each of the modules comprises a receiving antenna sub-group, a radio frequency receiver sub-group, and a configurable precision analog-to-digital converter.

In the seventh embodiment, one of the switch devices 221~22L is respectively and electrically connected to one of the corresponding radio frequency receiver sub-groups 211~21L and each of the corresponding configurable precision analog-to-digital converter 231~23L. The baseband processor 240 is electrically connected to the configurable precision analog-to-digital converters 231~23L and the analog-to-digital conversion controller 250. The analog-to-digital conversion controller 250 is respectively and electrically connected to the switch devices 221~22L and the configurable precision analog-to-digital converters 231~23L. As the same as the baseband processor 140 of the fourth embodiment of the present disclosure, the baseband processor 240 of the seventh embodiment comprises a channel estimation unit 241, a data detection unit 242, a demodulation unit 243, and a decoder 244. The data detection unit 242 is connected to the channel estimation unit 241 and the demodulation unit 243. The demodulation unit 243 is connected to the decoder 244.

In the seventh embodiment, the analog-to-digital conversion controller 250 determines mapping information (MI) and converter configurable information (ACI) according to the current channel information (CI) received by the baseband processor 240. The analog-to-digital conversion controller 250 respectively outputs the mapping information (MI) and the converter configurable information (ACI) to the switch devices 221~22L and the configurable precision analog-to-digital converters 231~23L. In the seventh embodiment, the mapping information (MI) comprises mapping vectors $M_1 \sim M_L$ used to respectively control the switch devices 221~22L, and the converter configurable information (ACI) is used to determine the resolution of the analog-to-digital converters composed in each of the configurable precision analog-to-digital converters 231~23L and the configuration of each of the configurable precision analog-to-digital converters 231~23L.

In the seventh embodiment, the operation method of the configurable precision analog-to-digital converter 130 disclosed in the first embodiment to the sixth embodiment all can be applied in each of the configurable precision analog-to-digital converters 231~23L. In addition, the analog-to-digital conversion controller 150 disclosed in the first embodiment to the sixth embodiment and the control method therein all can be applied in the analog-to-digital conversion controller 250. Therefore the configurable precision analog-to-digital converter of the present disclosure can also be applied in a massive MIMO communication system.

In summary, although the present disclosure is disclosed in the above embodiments, the present disclosure is not limited thereto. The following description is of the best-contemplated mode of carrying out the present disclosure. This description is made for the purpose of illustrating the general principles of the present disclosure and should not be taken in a limiting sense. Those skilled in the art should also realize that such equivalent constructions do not depart from the spirit and scope of the present disclosure, and that they may make various changes, substitutions, and alterations herein without departing from the spirit and scope of the present disclosure. Therefore the scope of the present disclosure is best determined by reference to the claims appended below.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or it is clear from context that they are to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

What is claimed is:

1. A receiver device used in a multi-input multi-output communication system, the receiver device comprising:
    a plurality of receiving antennas, used to receive a first number of analog radio frequency signals;
    a plurality of radio frequency receivers, respectively coupled to the receiving antennas, wherein the radio frequency receivers are used to process the first number of the analog radio frequency signals and generate the first number of analog baseband signals;
    a switch device, electrically connected to the radio frequency receivers, wherein the switch device receives the first number of the analog baseband signals and outputs, according to mapping information, a second number of analog baseband signals;
    a configurable precision analog-to-digital converter, electrically connected to the switch device, receiving the second number of the analog baseband signals, and generating a third number of first digital baseband signals, wherein the third number is less than the second number and the configurable precision analog-to-digital converter comprises:
        a plurality of first analog-to-digital converters, used to convert the second number of the analog baseband signals into the second number of second digital baseband signals, wherein the configurable precision analog-to-digital converter combines, according to converter configurable information, at least two of the first analog-to-digital converters as at least one second analog-to-digital converter so that the total number of the rest of the first analog-to-digital converters and the at least one second analog-to-digital converter is equal to the third number, and resolution of each of the second analog-to-digital converters is higher than resolution of each of the first analog-to-digital converters; and
        a bit combiner, used to converts the second number of the second digital baseband signals into the third number of the first digital baseband signals;
    a baseband processor, electrically connected to the switch device and the configurable precision analog-to-digital converter, and used to process the third number of the first digital baseband signals and output channel information according to the first digital baseband signals; and
    an analog-to-digital conversion controller, respectively and electrically connected to the switch device, the configurable precision analog-to-digital converter and the baseband processor, wherein the analog-to-digital conversion controller determines the mapping information and the converter configurable information according to the channel information; and
    wherein the analog-to-digital conversion controller respectively outputs the mapping information and the converter configurable information to the switch device and the configurable precision analog-to-digital converter.

2. The receiver device as claimed in claim 1, wherein the bit combiner integrates the second digital baseband signals outputted from each of the at least one second analog-to-digital converter as the single first digital baseband signal; and
    wherein the baseband processor obtains the channel information by the first digital baseband signals corresponding to the at least one second analog-to-digital converter.

3. The receiver device as claimed in claim 1, wherein resolutions of the first analog-to-digital converters are not all the same.

4. The receiver device as claimed in claim 1, wherein the second analog-to-digital converter is a pseudo high-precision analog-to-digital converter.

5. The receiver device as claimed in claim 1, wherein the analog-to-digital conversion controller further adjusts the mapping information and the converter configurable information according to a decoding result of a baseband processor of the receiver device so that the configurable precision analog-to-digital converter adjusts a resolution of the at least one second analog-to-digital converter.

6. A control method applied to the receiver device as claimed in claim 1, the control method comprising:
   determining whether the analog-to-digital conversion controller has full channel statistical information of the multi-input multi-output communication system or not according to the channel information;
   informing the receiver device to be in a first mode or a second mode according to obtaining the full channel statistical information or not;
   informing the receiver device to be in the first mode if the full channel statistical information is not obtained, wherein when the receiver device is in the first mode, the analog-to-digital conversion controller periodically changes the mapping information so that each of the second analog-to-digital converters in turn outputs each of the first digital baseband signals corresponding to each of the receiving antennas.

7. The receiver device as claimed in claim 2, wherein when the analog-to-digital conversion controller does not have full channel statistical information of the multi-input multi-output communication system, the analog-to-digital conversion controller informs the receiver device being in a first mode;
   wherein when the receiver device is in the first mode, the analog-to-digital conversion controller periodically changes the mapping information so that each of the second analog-to-digital converters in turn outputs each of the first digital baseband signals corresponding to each of the receiving antennas; and
   wherein the baseband processor obtains the channel information according to the first digital baseband signals which are corresponding to the at least one second analog-to-digital converter.

8. The receiver device as claimed in claim 2, wherein when the analog-to-digital conversion controller obtains full channel statistical information of the multi-input multi-output communication system according to the channel information, the analog-to-digital conversion controller informs the receiver device being in a second mode and the analog-to-digital conversion controller that periodically changes the mapping information in a coherence time of the multi-input multi-output communication system according to the full channel statistical information;
   wherein the receiver device is in the second mode, the analog-to-digital conversion controller adjusts, according to the full channel statistical information, the mapping information and the converter configurable information to change configuration of the configurable precision analog-to-digital converter.

9. The receiver device as claimed in claim 5, wherein when the resolution of the at least one second analog-to-digital converter is increased, the number of the first analog-to-digital converters composed in the second analog-to-digital converter increases.

10. The control method as claimed in claim 6, further comprising:
   integrating the second digital baseband signals outputted from each of the at least one second analog-to-digital converter as the single first digital baseband signal; and
   obtaining, by the baseband processor, the channel information according to the first digital baseband signals which are corresponding to the at least one second analog-to-digital converter.

11. The receiver device as claimed in claim 8, wherein when the analog-to-digital conversion controller obtains that a current channel changing rate exceeds a predetermined changing rate according to the full channel statistical information, the analog-to-digital conversion controller adjusts the mapping information and the converter configurable information so that the configurable precision analog-to-digital converter increases the number of the at least one second analog-to-digital converter; and
   wherein the configurable precision analog-to-digital converter sequentially receives the analog radio frequency signals corresponding to the receiving antennas.

12. The receiver device as claimed in claim 8, wherein when the analog-to-digital conversion controller obtains that a current channel changing rate exceeds a predetermined changing rate according to the full channel statistical information, the analog-to-digital conversion controller adjusts the mapping information so that the switch device discards the analog radio frequency signal of the receiving antenna having the worst channel effect; and
   wherein the analog-to-digital conversion controller adjusts the converter configurable information so that the number of the at least one second analog-to-digital converter of the configurable precision analog-to-digital converter remains unchanged.

13. The receiver device as claimed in claim 8, wherein when the analog-to-digital conversion controller obtains that a current channel changing rate is lower than a predetermined changing rate according to the full channel statistical information, the analog-to-digital conversion controller adjusts the mapping information and the converter configurable information so that the configurable precision analog-to-digital converter decreases the number of the at least one second analog-to-digital converter.

14. The receiver device as claimed in claim 8, wherein when the analog-to-digital conversion controller obtains that a current channel changing rate is lower than a predetermined changing rate according to the full channel statistical information, the analog-to-digital conversion controller does not adjust the converter configurable information so that the number of the at least one second analog-to-digital converter of the configurable precision analog-to-digital converter remains unchanged.

15. The control method as claimed in claim 10, further comprising informing the receiver device to be in the second mode if the full channel statistical information is obtained;
   changing, periodically, the mapping information in a coherence time of the multi-input multi-output communication system according to the full channel statistical information; and
   adjusting, according to the full channel statistical information, the mapping information and the converter configurable information to change configuration of the configurable precision analog-to-digital converter if the receiver device is in the second mode.

16. The control method as claimed in claim 10, further comprising adjusting, according to a decoding result of a baseband processor of the receiver device, the mapping information and the converter configurable information so that the configurable precision analog-to-digital converter adjusts a resolution of the at least one second analog-to-digital converter.

17. The receiver device as claimed in claim 13, wherein when the analog-to-digital conversion controller obtains that the current channel changing rate is lower than the predetermined changing rate according to the full channel statistical information, the analog-to-digital conversion controller adjusts the mapping information and the converter configurable information so that the configurable precision analog-to-digital converter increases the number of the first analogto-digital converters composed in each of the at least one second analog-to-digital converter.

18. The control method as claimed in claim 15, wherein when the analog-to-digital conversion controller obtains that a current channel changing rate exceeds a predetermined changing rate according to the full channel statistical information, the control method further comprises:
- adjusting the mapping information and the converter configurable information so that the configurable precision analog-to-digital converter increases the number of the at least one second analog-to-digital converter; and
- sequentially receiving, by the configurable precision analog-to-digital converter, the analog radio frequency signals corresponding to the receiving antennas.

19. The control method as claimed in claim 15, wherein when the analog-to-digital conversion controller obtains that a current channel changing rate exceeds a predetermined changing rate according to the full channel statistical information, the control method further comprises:
- adjusts the mapping information so that the switch device discards the analog radio frequency signal of the receiving antenna having the worst channel effect; and
- adjusting the converter configurable information so that the number of the at least one second analog-to-digital converter of the configurable precision analog-to-digital converter remains unchanged.

20. The control method as claimed in claim 15, further comprising when the analog-to-digital conversion controller obtains that a current channel changing rate is lower than a predetermined changing rate according to the full channel statistical information, the analog-to-digital conversion controller adjusts the mapping information and the converter configurable information so that the configurable precision analog-to-digital converter reduces the number of the at least one second analog-to-digital converter.

21. The control method as claimed in claim 15, further comprising when the analog-to-digital conversion controller obtains that a current channel changing rate is lower than a predetermined changing rate according to the full channel statistical information, the analog-to-digital conversion controller does not adjust the converter configurable information so that the number of the at least one second analog-to-digital converter of the configurable precision analog-to-digital converter remains unchanged.

22. The control method as claimed in claim 16, wherein when the resolution of the at least one second analog-to-digital converter is increased, the number of the first analog-to-digital converters composed in the second analog-to-digital converter increases.

23. The control method as claimed in claim 20, further comprising when the analog-to-digital conversion controller obtains that the current channel changing rate is lower than the predetermined changing rate according to the full channel statistical information, the analog-to-digital conversion controller adjusts the mapping information and the converter configurable information so that the configurable precision analog-to-digital converter increases the number of the first analog-to-digital converters composed in each of the at least one second analog-to-digital converter.

* * * * *